United States Patent [19]

Iwamatsu et al.

[11] Patent Number: 5,609,977
[45] Date of Patent: Mar. 11, 1997

[54] REFLECTION PHASE SHIFTING MASK AND METHOD OF FORMING A PATTERN USING THE SAME

[75] Inventors: Takayuki Iwamatsu, Abiko; Kenji Kawano, Tokyo; Hideya Miyazaki, Kawasaki; Shinichi Ito, Yokohama; Soichi Inoue, Yokohama; Hiroyuki Sato, Yokohama; Satoshi Tanaka, Kawasaki, all of Japan; Koji Hashimoto, Wappingers Falls, N.Y.

[73] Assignee: Kabushiki Kaisha Toshiba, Kawasaki, Japan

[21] Appl. No.: 589,638

[22] Filed: Jan. 22, 1996

Related U.S. Application Data

[63] Continuation of Ser. No. 249,038, May 29, 1994, Pat. No. 5,514,499.

[30] Foreign Application Priority Data

| May 25, 1993 | [JP] | Japan | 5-122816 |
| Jun. 28, 1993 | [JP] | Japan | 5-156454 |
| Dec. 28, 1993 | [JP] | Japan | 5-336849 |
| May 23, 1994 | [JP] | Japan | 6-108700 |
| May 23, 1994 | [JP] | Japan | 6-108701 |

[51] Int. Cl.$^6$ .................................................... G03F 9/00
[52] U.S. Cl. .............................. 430/5; 430/311; 430/315; 430/322; 378/34
[58] Field of Search ............................ 430/5, 311, 315, 430/322, 394; 378/34, 35

[56] References Cited

U.S. PATENT DOCUMENTS

| 5,040,882 | 8/1991 | Markle | 359/727 |
| 5,318,868 | 6/1994 | Hasegawa et al. | 430/5 |
| 5,328,784 | 7/1994 | Fukuda | 430/5 |
| 5,338,647 | 8/1994 | Nakagawa et al. | 430/322 |
| 5,399,448 | 3/1995 | Nagata et al. | 430/5 |

FOREIGN PATENT DOCUMENTS

3266842  11/1991  Japan.

Primary Examiner—S. Rosasco
Attorney, Agent, or Firm—Oblon, Spivak, McClelland, Maier & Neustadt, P.C.

[57] ABSTRACT

A reflection phase shifting mask used to expose a pattern by forming reflected light having a phase difference upon reflection of light, includes a substrate for reflecting exposure light, a phase shifting layer formed on a portion on the substrate, and a light transmitting medium formed on the substrate and the phase shifting layer, wherein the thickness of the phase shifting layer is set such that the phase difference between light reflected by the substrate and light reflected by the phase shifting layer becomes 180°.

10 Claims, 16 Drawing Sheets

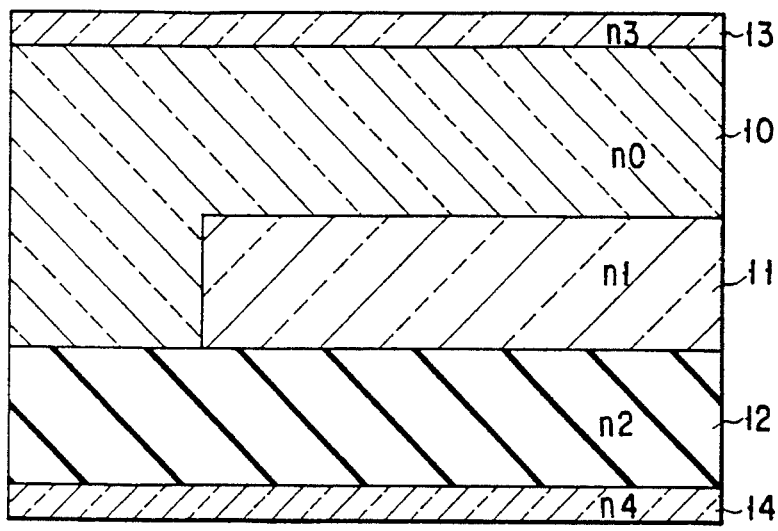
F I G. 1
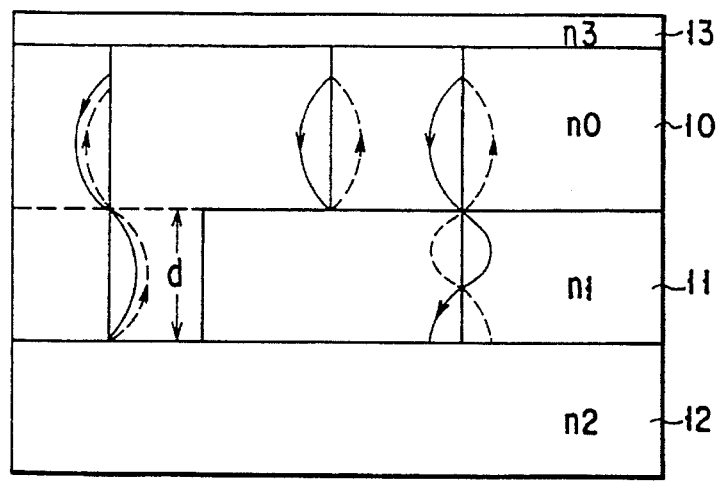
($n1 < n0 < n2$)
F I G. 2A
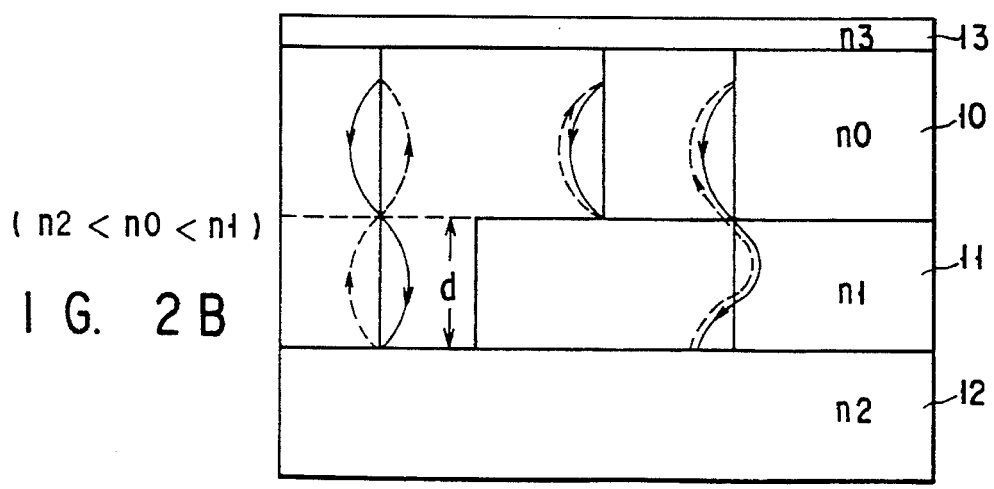
($n2 < n0 < n1$)
F I G. 2B

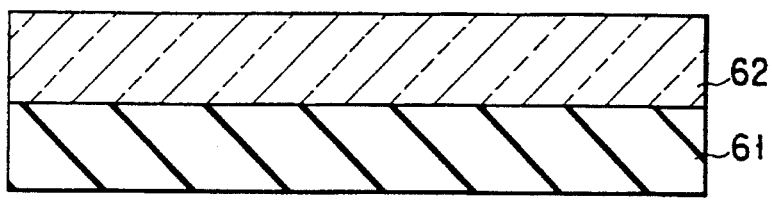
F I G. 5A
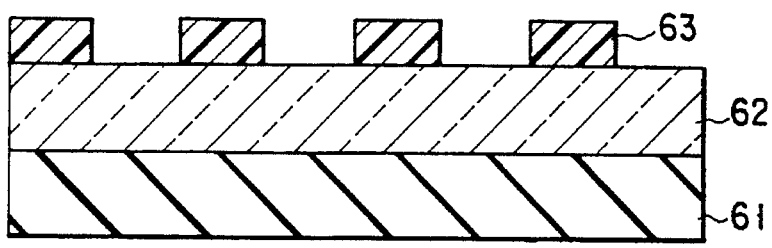
F I G. 5B
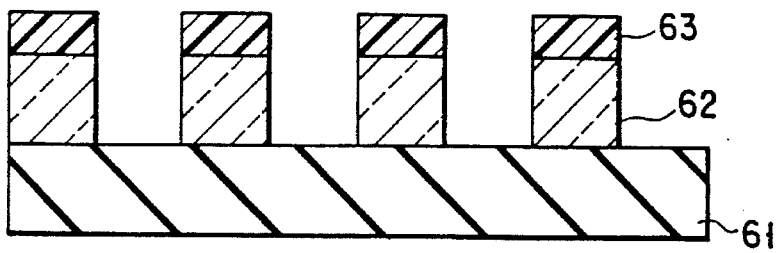
F I G. 5C
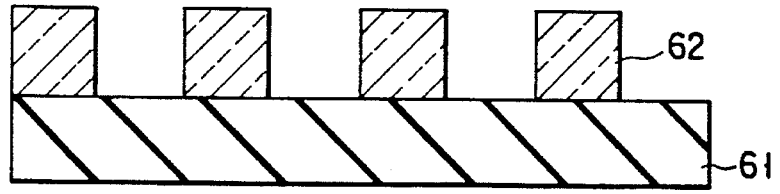
F I G. 5D

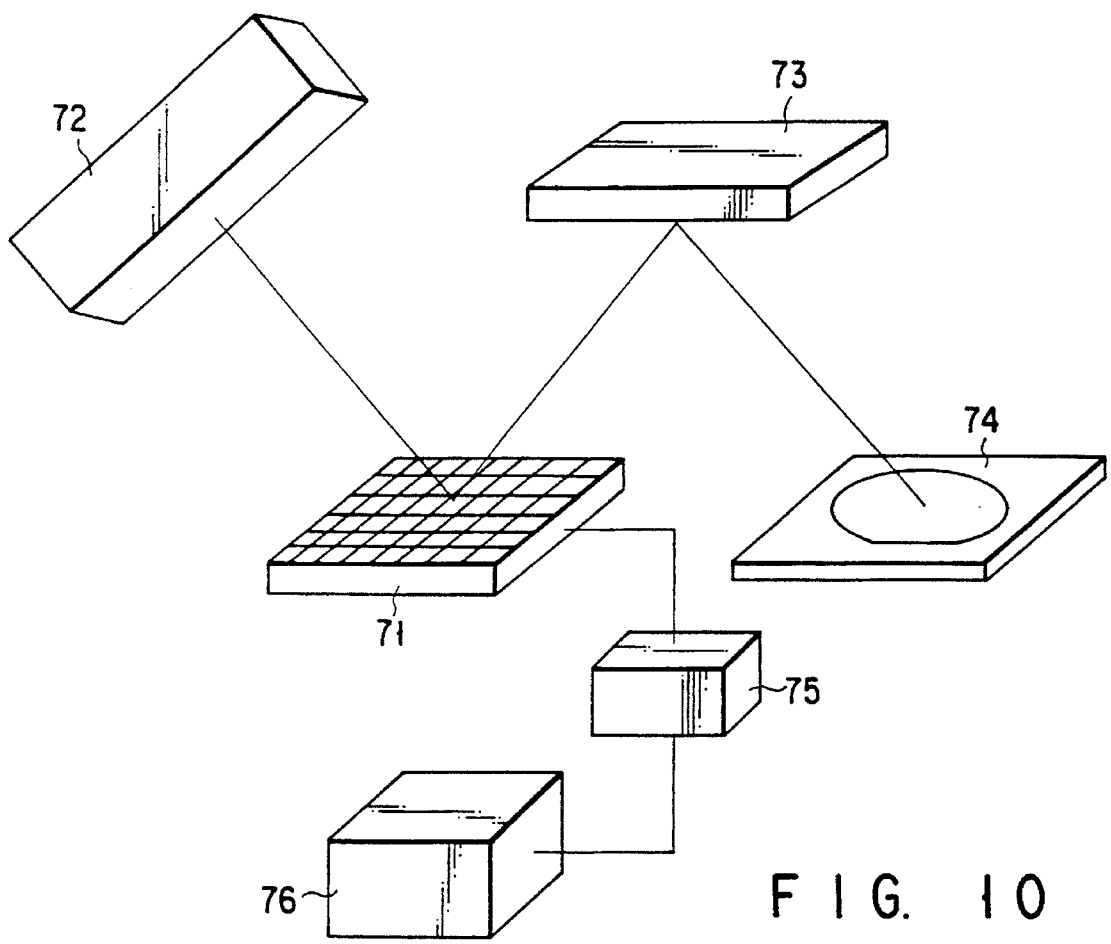
F I G. 10
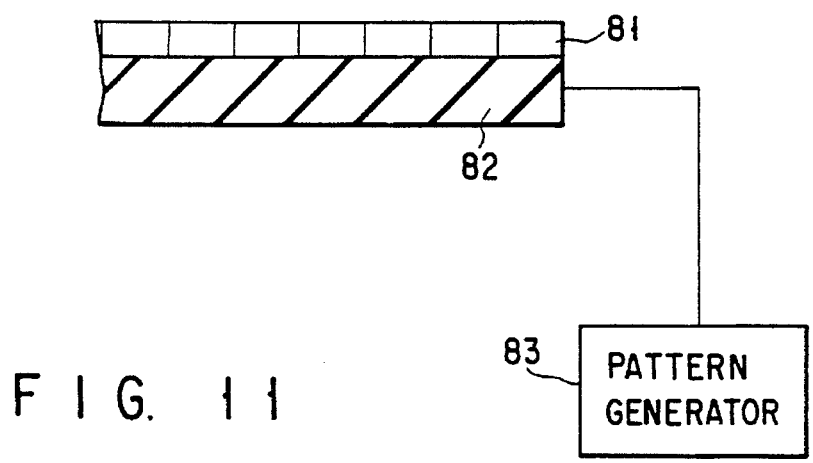
F I G. 11

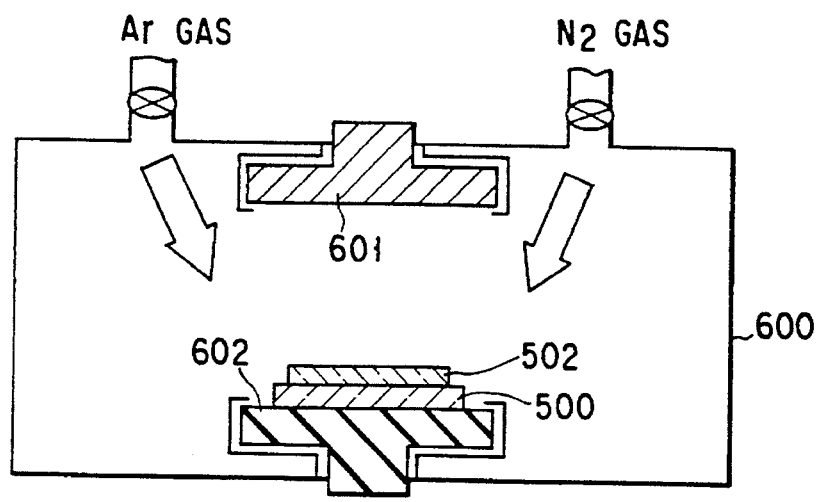
F I G. 20A
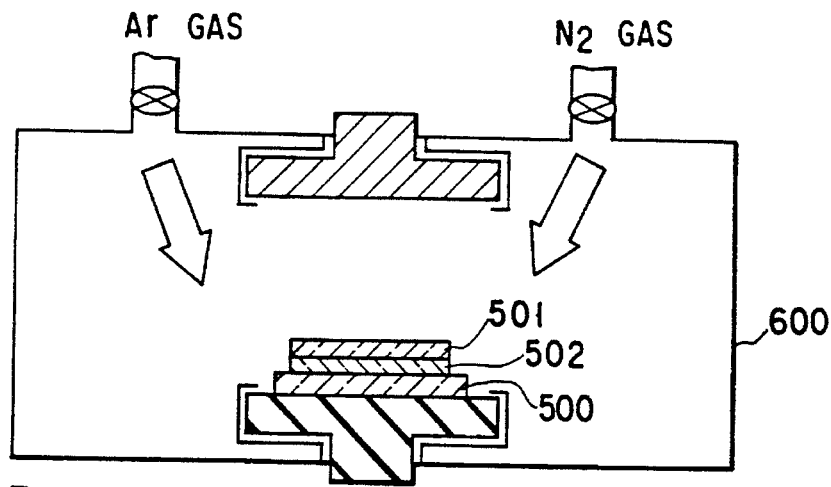
F I G. 20B
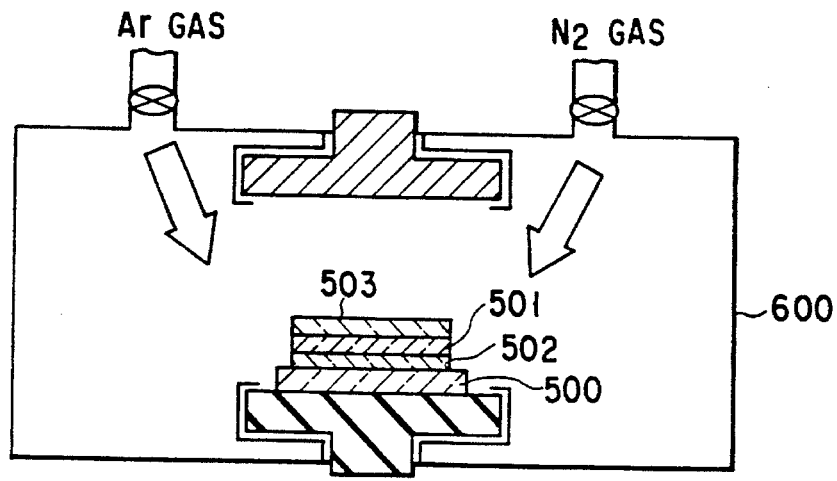
F I G. 20C

REFLECTION PHASE SHIFTING MASK AND METHOD OF FORMING A PATTERN USING THE SAME

This is a continuation, of application Ser. No. 08/249,038 filed on May 25, 1994, U.S. Pat. No. 5,514,499.

BACKGROUND OF THE INVENTION

1. Field of the Invention

The present invention relates to a lithographic technique used in the semiconductor industry and the like and, more particularly, to a phase shifting mask which can realize a high resolution and a method of forming a pattern.

2. Description of the Related Art

In the semiconductor industry, with an increase in the integration density of ICs, it is required to manufacture fine patterns. In order to realize this, the resolution in lithography must be increased. As a means for achieving a high resolution, phase shifting methods have been proposed. As such phase shifting methods, various methods including a Levenson method (MARC D. LEVENSON: IEEE TRANSACTIONS ON ELECTRON DEVICE VOL ED-29 NO. 12 DECEMBER (1982) 1828) are known. Transmission masks are generally used in these methods.

A technique of using an exposure mask as a transmission phase shifting mask has been proposed. This mask is obtained by forming translucent and transparent regions on a transparent substrate such that the phase difference between light beams respectively transmitted through the translucent and the transparent regions becomes substantially 180°. An example of this exposure mask is disclosed in U.S. Pat. No. 4,890,309 to Smith et al. of MIT. In this mask, a multilayered structure is employed to realize the optimal values of a film transmissivity characterizing a translucent region and a phase difference with respect to light transmitted through a transparent region.

In the future, with an increase in the integration density of LSIs, in order to achieve a technique of forming finer patterns, the wavelength of light emitted from a light source must be decreased. Especially for a 1-Gbit DRAM, a 0.2-μm pattern is required; and for a 4-Gbit DRAM, a 0.1-μm pattern. In order to realize these patterns, ArF (193 nm) or exposure light having a shorter wavelength must be used.

However, a currently used transmission substrate such as a quartz substrate also absorbs light having a short wavelength. For this reason, variations in transmissivity due to light absorption and a deterioration in durability due to thermal expansion raise problems. In order to solve these problems, searches for materials for transmission phase shifting masks, which absorb no light, have been made, or attempts have been made to change the optical characteristics of the masks.

A resolution in lithography is in inverse proportion to a numerical aperture and in direct proportion to a wavelength. Since an increase in numerical aperture is limited, the wavelength of light needs to be decreased to increase the resolution. However, as the wavelength of light emitted from an exposure light source decreases, a conventional transmission mask undergoes a decrease in transmissivity, resulting in a decrease in resolution. For this reason, for a transmission phase shifting mask, a material which can obtain a high transmissivity with respect to light having a short wavelength must be developed. It is, however, difficult to find or manufacture a material which can obtain a high transmissivity with respect to light having a short wavelength.

Under she circumstances, a reflection phase shifting mask has recently been proposed, which is free from the problem of a deterioration in quality due to radiation of light in a transmission phase shifting mask. In this mask, a recess portion (phase shifting portion) is formed in a substrate surface, and a phase difference of 180° is realized by using an optical path difference between the bottom surface of the recess portion and the substrate surface.

The following problem is posed in a mask of this type. The recess portion is formed by etching. However, it is very difficult to accurately control the etching depth. Especially, it is inevitable that the etching depth varies depending on the coarseness fineness of patterns. When reflection of light is utilized, the amount of change in optical path length is equivalent to twice the amount of change in etching depth. It is, therefore, substantially difficult to realize a phase difference of 180° between light reflected by the substrate surface and light reflected by the phase shifting portion.

As a method of improving a transmission phase shifting mask, a method of using a mask blank including a single-layered translucent film which can arbitrarily change the complex index of refraction in a given region has been proposed by the present inventors (Japanese Patent Application No. 4-327623). As a material for this single-layered translucent film, a thin silicon nitride film formed by reactive sputtering is available. By exposing this film using a mask with patterns such as holes and lines, the resolution and the depth of focus can be increased.

In a method of this type, however, the following problem has been posed. When a material having a large refractive index is used for a translucent region, the reflectance at the boundary surface between the translucent film and an exposure atmosphere becomes high. Light reflected by a film surface is focused, as an inverted mask pattern, on a wafer via a demagnifying lens. For this reason, a region which should be a dark portion has a light intensity, so that deteriorations in resist pattern shape such as film thinning are caused.

SUMMARY OF THE INVENTION

It is an object of the present invention to provide a reflection phase shifting mask which can solve the problem of deterioration in quality due to radiation, posed in a transmission mask, and which can have a phase difference of 180° between light reflected by a substrate surface and light reflected by a phase shifting portion.

It is another object of the present invention to provide a reflection phase shifting mask designed to prevent exposure light from being influenced by a phase amount error with respect to an etching amount in the direction of depth by using only surface reflected light in controlling a phase difference.

It is still another object of the present invention to provide an exposure mask which can reduce the reflectance on a film surface with respect to exposure light in a transmission shift mask so as to contribute to an improvement in image intensity contrast.

It is still another object of the present invention to provide a method of forming a pattern, in which only an optical deterioration is minimized in the use of a phase shifting mask of the present invention.

In order to achieve the above objects, according to the first aspect of the present invention, there is provided a reflection phase shifting mask used to expose a pattern by forming reflected light having a phase difference upon reflection of light, comprising a substrate for reflecting exposure light, a phase shifting layer formed on a portion on the substrate, and a light transmitting medium formed on the substrate and the phase shifting layer, wherein a thickness of the phase shifting layer is set such that a phase difference between light reflected by the substrate and light reflected by the phase shifting layer becomes 180°.

In the present invention, in order to get a phase difference of 180° between light reflected by the substrate and light reflected by the phase shifter (phase shifting layer) in consideration of multiple reflection, the following arrangement is employed. Letting $n_0$ be the refractive index of the light transmitting medium, $n_1$ be the refractive index of the phase shifter, and $n_2$ be the refractive index of the substrate, the relationship in magnitude between the refractive indexes, a thickness d of the phase shifter, and the refractive index $n_0$ of the light transmitting medium are set as follows. Note that H and L represent integers, and H<L. The refractive index $n_1$ and the thickness d of the phase shifter are determined such that (a) when $n_1<n_0<n_2$, the refractive index $n_1$ and the thickness d of the material having the refractive index $n_1$ satisfy $\{(H+0.06\ L)/1.06\ L\}n_0<n_1<\{(H-0.06\ L)/0.94\ L\}n_0$ $d=(L/2n_0\pm 0.06/4n_1)\lambda$ and (b) when $n_2<n_0<n_1$, the refractive index $n_1$ and the thickness d of the material having the refractive index $n_1$ satisfy $\{(H-0.06\ L)/0.94\ L\}n_0<n_1<\{(H+0.06\ L/1.06\ L\}n_0$ $d=\{(2L+1)/4n_0\pm 0.06/4n_1\}\lambda$ In addition, in both cases (a) and (b), H and L are integers, and the refractive indexes may be determined to satisfy the corresponding inequalities.

The thickness and refractive index of the phase shifting layer are set such that light reflected by the phase shifting layer has substantially the same phase as that of light which is transmitted through the phase shifting layer, reflected by the substrate, and output from the phase shifting layer.

Alternatively, the thickness and refractive index of the phase shifting layer may be set such that the phase difference between light reflected by the phase shifting layer and light which is transmitted through the phase shifting layer, reflected by the substrate, and output from the phase shifting layer becomes substantially 180°.

The following are preferable embodiments of the present invention:

(1) The light transmitting medium is air, a nitride atmosphere, or a vacuum.

(2) The light transmitting medium is made of a solid material having a high transmissivity.

(3) An antireflection film having a reflectance of 2% or less, preferably 1%, is formed on the light transmitting medium.

(4) with regard to the thickness d of the phase shifter, the phase difference is allowed to vary within the range of 180°±10°, and a tolerance δ of the thickness of the phase shifter is set to be about $0.06\lambda/(4n_1)$.

According to the second aspect of the present invention, there is provided a reflection phase shifting mask used to expose a pattern by forming reflected light having a phase difference upon reflection of light, comprising a substrate, two types of reflective material layers alternately arranged on/along the substrate and having complex indexes of refraction $<N_x>=n_x-ik_x$ (x=1, 2), and a light transmitting medium formed on the reflective material layer and having a complex index of refraction $<N_a>=n_a-ik_a$, wherein optical constants of the reflective material layers have a relationship expressed by $$n_1^2+k_1^2<n_a^2+k_a^2<n_2^2+k_2^2$$

According to a modification of the second aspect, there is provided a reflection phase shifting mask wherein materials whose reflectances or phases with respect to a wavelength of exposure light are changed by external signals or the like based on electricity, light, heat, or a magnetic field are arranged in the form of cells, at least two reflective regions whose reflectances or phases on the surfaces of the materials arranged in the form of cells with respect to the wavelength of the exposure light are changed in accordance with a difference between the signals are formed, and a ratio of a reflectance of one of the two reflective regions which has a lower reflectance to a reflectance of the other reflective region having a higher reflectance is 0.01 to 0.2.

Similar to the second aspect, in the phase shifting mask of this modification, two types of reflective material layers, each having a complex index of refraction $<N_x>=n_x-ik_x$(x=1, 2), are formed on a substrate by signals or the like based on electricity, light, heat, or a magnetic field, and a light transmitting medium having a complex index of refraction $<N_a>=n_a-ik_a$ is arranged on a surface on which the reflective regions are arranged. In addition, the optical constants of the reflective material layers have a relationship expressed by $$n_1^2+k_1^2<n_a^2+k_a^2<n_2^2+k_2^2$$

The following are preferable embodiments of the present invention:

(1) $n_x^2+k_x^2$ is infinitely close to $na^2$.

(2) Letting $n_a$ be the refractive index of the light transmitting medium, and $n_x$ (x=1, 2) be the refractive index of the reflective material (region), a material is selected to minimize a difference D between the squares of the optical constants ($D=(n_1^2+k_1^2)-(n_2^2+k_2^2)$). In this case, if the refractive index $n_a$ of the light transmitting medium is large, a reflection reducing layer having a reflectance of 2% or less is preferably formed to suppress reflection on the surface of the medium. The reflectance of the reflection reducing layer is preferably 1% or less.

(3) The reflectivity of one of the two types of reflective material layers (regions) which has a lower reflectivity is 1 to 20% of the reflectivity of the other region having a higher reflectivity.

(4) The reflectivity of one of the two types of reflective material layers (regions) which has a lower reflectivity is 90 to 100% of the reflectivity of the other region having a higher reflectivity, and the region having a lower reflectivity partly has a light-shielding region having a reflectivity of 0 to 20%.

(5) Pattern reflecting surfaces constituted by the two types of reflective material layers (regions) are located on the same plane.

(6) Pattern reflecting surfaces constituted by the two types of reflective material layers (regions) are located in different planes.

(7) The absolute value of the phase difference of exposure light, which occurs between the two types of reflective material layers and the light transmitting medium, is 85° or more, and the layers are made of materials having different signs.

Preferably, the relationship between the reflectances of the two types of reflective material layers (regions) is set such that the ratio of the reflectance of one region having a lower reflectance to the reflectance of the other region having a higher reflectivity is 0.9 or more or 0.01 to 0.2.

(8) In order to prevent attenuation of the intensity of exposure light in the light transmitting medium having the complex index of refraction $<N_a>=n_a-ik_a$, it is preferable that the extinction coefficient $k_a$ be infinitely close to 0.

In addition, with regard to the thickness of the reflective material layer of the mask, the phase difference is allowed to vary within the range of $180°\pm10°$, and a tolerance $\delta$ of the thickness of the phase shifter is set to be about $0.06\lambda/(4n_x)$.

According to the present invention, there is provided a method of forming a pattern, comprising the steps of preparing a reflection phase shifting mask of the present invention, radiating exposure light having a shorter wavelength than an ultraviolet ray onto the reflection phase shifting mask parallelly or obliquely with respect to an optical axis, and performing reduction or one-to-one exposure of a mask pattern image onto a high-reflectance substrate or exposure substrate, on which a photosensitive resin layer constituted by at least one layer is formed, via an exposure optical system using a transmission or reflection optical system, and removing the photosensitive resin layer from a region other than a desired region by using an exposure amount difference in the high-reflectance substrate or the exposure substrate, thereby forming a desired pattern.

The following are preferable embodiments of the method of forming a pattern:

(1) The coherent factor of the illumination light is set to 0.5 or less when the mask pattern has at least a portion at which the ratio of the area of a portion on which the translucent film is formed to the area of a portion on which no translucent film is formed is 0.3 or less or 3 or more.

(2) Annular illumination light is used as the illumination light when the mask pattern has at least a portion at which the ratio of the area of a portion on which the translucent film is formed to the area of a portion on which no translucent film is formed is 0.3 to 3.

It is more preferable that at least a portion of a system for the illumination light be adjusted to exhibit a phase of light or transmissivity different from that exhibited by the remaining portion of the system for the illumination light.

(3) Light obtained through a diaphragm having aperture portions formed at n (n=2, 4, 8) positions symmetrical about an optical axis is used as the illumination light when the mask pattern has at least a portion at which the ratio of the area of a portion on which the translucent film is formed to the area of the portion on which no translucent film is formed is 0.3 to 3.

It is more preferable that at least a portion of a system for the illumination light be adjusted to exhibit a phase of light or transmissivity different from that exhibited by the remaining portion of the system for the illumination light.

(4) Light obtained through a diaphragm having aperture portions formed at a plurality of sets of n (n=2, 4, 8) positions symmetrical about an optical axis is used as the exposure light when the transmission phase shifting mask has at least a portion at which the ratio of the area of a portion on which the translucent film is formed to the area of a portion on which no translucent film is formed is 0.3 to 3.

It is more preferable that at least a portion of a system for the illumination light be adjusted to exhibit a phase of light or transmissivity different from that exhibited by the remaining portion of the system for the illumination light.

(5) In a method of radiating the exposure light onto the substrate, the incident angle of the exposure light is adjusted such that the ratio between the reflectances of at least two types of reflective materials is set to be a desired value.

(6) In the method of radiating the exposure light onto the substrate, the incident angle of the exposure light is adjusted such that the phase difference between light reflected by at least two types of reflective materials is set to be a desired value.

(7) In the method of radiating the exposure light onto the substrate, the incident angle of the exposure light is adjusted such that the ratio between the reflectances of at least two types of reflective materials and the phase difference between light reflected thereby are set to be desired values at once.

According to the third aspect of the present invention, there is provided a transmission phase shifting mask which has regions which are formed on a transparent substrate and are respectively translucent and transparent to exposure light and which is designed such that a phase difference between light transmitted through the translucent region and light transmitted through the transparent region and a transmissivity of the translucent region are set to be desired values, wherein the translucent region is a multilayered structure formed by stacking a translucent film and a reflection reducing layer on each other, and is designed such that a phase difference between light transmitted through the multilayered structure and light transmitted through the transparent region is substantially set to be about 180°, and a reflectance of the multilayered structure with respect to exposure light becomes lower than that of the translucent film.

The following are preferable embodiments of the mask:

(1) The absolute value of the complex index of refraction of the translucent film is set to be larger than that of the reflection reducing layer.

(2) The translucent film contains a Group III element, a Group IV element, a transition element, or a transition element silicide, and the reflection reducing layer contains an oxide, nitride, halide, or oxynitride of a Group III element, Group IV element, transition element, or transition element silicide.

Preferably, the Group III element is selected from B, Al, and Ga; the Group IV element, from C, Si, Ge, and Sn; and the transition element, from Cr, Mo, W, Ni, Ti, Cu, Hf, Ta, and Co.

(3) A hydrogen atom may be added in the reflection reducing layer.

According to the fourth aspect of the present invention, there is provided a transmission phase shifting mask which has regions which are formed on a transparent substrate and are respectively translucent and transparent to exposure light and which is designed such that a phase difference between light transmitted through the translucent region and light transmitted through the transparent region is set to be a desired value, wherein the translucent region is made of materials whose refractive indexes continuously increase away from a transparent substrate side up to a maximum value, and continuously decrease afterward.

According to a modification of the fourth aspect of the present invention, there is provided a transmission phase shifting mask which has regions which are formed on a transparent substrate and are respectively translucent and transparent to exposure light and which is designed such that a phase difference between light transmitted through the translucent region and light transmitted through the transparent region is set to be a desired value, wherein the translucent region is made of a plurality of thin films whose refractive indexes continuously increase from a transparent substrate side up to a maximum value with respect to a stacking direction of the thin films, and continuously decrease afterward.

The following are preferable embodiments of the mask:
(1) The translucent region contains a Group III element, a Group IV element, a transition element, or a transition element silicide, and is adjusted by changing the composition of an oxide, nitride, halide, or oxynitride of a Group III element, Group IV element, transition element, or transition element silicide.

Preferably, the Group III element is selected from B, Al, and Ga; the Group IV element, from C, Si, Ge, and Sn; and the transition element, from Cr, Mo, W, Ni, Ti, Cu, Hf, Ta, and Co.

(2) A hydrogen atom may be added in the reflection reducing layer.

(3) When the extinction coefficient of the translucent region containing only an element group of a Group III element, a Group IV element, a transition element, or a transition element silicide is larger than the extinction coefficient of a translucent region containing a compound obtained when the element group is saturated by a non-metallic element contained in a reflection reducing layer, the translucent region whose optical constants continuously change in the direction of thickness is designed to maximize the extinction coefficient of a portion other than the boundary surfaces between the translucent region and the substrate, and between the translucent region and air.

(4) When the refractive index of the translucent region containing only an element group of a Group III element, a Group IV element, a transition element, or a transition element silicide is larger than the refractive index of a translucent region containing a compound obtained when the element group is saturated by a non-metallic element contained in a reflection reducing layer, the translucent region whose optical constants continuously change in the direction of thickness is designed to maximize the refractive index of a portion other than the boundary surfaces between the translucent region and the substrate, and between the translucent region and air.

According to the fifth aspect of the present invention, there is provided a method of forming a pattern, comprising at least the steps of: preparing a phase shifting mask according to the third aspect of the present invention; radiating exposure light having a shorter wavelength than that of an ultraviolet ray onto the phase shifting mask parallelly or obliquely with respect to an optical axis, and performing reduction or one-to-one exposure of a mask pattern image onto a high-reflectance substrate or exposure substrate, on which a photosensitive resin layer constituted by at least one layer is formed, via an exposure optical system using a transmission or reflection optical system; and removing the photosensitive resin layer from a region other than a desired region by using an exposure amount difference in the high-reflectance substrate or the exposure substrate, thereby forming a desired pattern.

According to the sixth aspect of the present invention, there is provided a method of forming a pattern, comprising at least the steps of: preparing a phase shifting mask according to the fourth aspect of the present invention; radiating exposure light having a shorter wavelength than that of an ultraviolet ray onto the phase shifting mask parallelly or obliquely with respect to an optical axis, and performing reduction or one-to-one exposure of a mask pattern image onto a high-reflectance substrate or exposure substrate, on which a photosensitive resin layer constituted by at least one layer is formed, via an exposure optical system using a transmission or reflection optical system; and removing the photosensitive resin layer from a region other than a desired region by using an exposure amount difference in the high-reflectance substrate or the exposure substrate, thereby forming a desired pattern.

The following are preferable embodiments of the method of forming a pattern:
(1) The coherent factor of the illumination light is set to 0.5 or less when the mask pattern has at least a portion at which the ratio of the area of a portion on which the translucent film is formed to the area of a portion on which no translucent film is formed is 0.3 or less or 3 or more.

(2) Annular illumination light is used as the illumination light when the mask pattern has at least a portion at which the ratio of the area of a portion on which the translucent film is formed to the area of a portion on which no translucent film is formed is 0.3 to 3.

It is more preferable that at least a portion of the illumination light be adjusted to exhibit a phase of light or transmissivity different from that exhibited by the remaining portion of the illumination light.

(3) Light obtained through a diaphragm having aperture portions formed at n (n=2, 4, 8) positions symmetrical about an optical axis is used as the illumination light when the mask pattern has at least a portion at which the ratio of the area of a portion on which the translucent film is formed to the area of the portion on which no translucent film is formed is 0.3 to 3.

It is more preferable that at least a portion of the illumination light be adjusted to exhibit a phase of light or transmissivity different from that exhibited by the remaining portion of the illumination light.

(4) Light obtained through a diaphragm having aperture portions formed at a plurality of sets of n (n=2, 4, 8) positions symmetrical about an optical axis is used as the exposure light when the transmission phase shifting mask has at least a portion at which the ratio of the area of a portion on which the translucent film is formed to the area of a portion on which no translucent film is formed is 0.3 to 3.

It is more preferable that at least a portion of the illumination light be adjusted to exhibit a phase of light or transmissivity different from that exhibited by the remaining portion of the illumination light.

A transmission phase shifting mask of the present invention is manufactured in the following manner. A translucent film is formed on a transparent substrate by a reactive sputtering method, a vapor deposition method, or a CVD method. A transparent thin film having an antireflection effect with respect to exposure light is formed on the translucent film by a sputtering method, a vapor deposition method, a CVD method, or a liquid-phase epitaxial growth method (a method of, for example, saturating an $SiO_2$ powder in an aqueous solution of hydrosilicofluoric acid, and soaking a substrate with the solution, thereby precipitating an $SiO_2$ film on the substrate surface), or oxidizing the translucent film surface, or forming a film by changing the gas condition for the formation of the translucent film. In this case, by properly controlling SiO$_2$ or the thickness of a translucent film obtained by changing the composition, the reflectance of the film on the transparent substrate can be reduced. A pattern constituted by pin holes, lines, and spaces is formed on this photo mask blank to form regions transparent and translucent to exposure light. In this case, the thickness and quality of each film of the mask is designed such that the phase difference between light transmitted through the transparent region and light transmitted through the translucent region substantially becomes about 180°.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view showing the arrangement of a reflection phase shifting mask according to the present invention;

FIGS. 2A and 2B are charts for explaining the principle of the reflection phase shifting mask according to the present invention, in which FIG. 2A shows a case wherein the reflectances of the components of the mask have a relationship of ($n_1 < n_0 < n_2$), and FIG. 2B shows a case wherein the reflectances of the components of the mask have a relationship of ($n_2 < n_0 < n_1$);

FIGS. 5A to 5D are sectional views of a reflection phase shifting mask, showing the first half of a manufacturing process according to the second embodiment of the present invention;

FIG. 10 is a perspective view showing the schematic arrangement of a pattern transfer apparatus according to the third and fourth embodiments of the present invention;

FIG. 11 is a partially sectional view showing the basic arrangement of a mask used in the pattern transfer apparatus of the third embodiment;

FIGS. 20A to 20C are sectional views showing the steps in manufacturing a translucent film according to the sixteenth and seventeenth embodiments;

DETAILED DESCRIPTION OF THE PREFERRED EMBODIMENTS

Figure 3A:
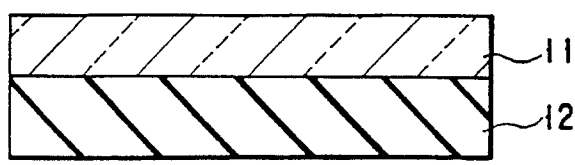
FIGS. 3A to 3D are sectional views of a reflection phase shifting mask, showing the first half of a manufacturing process according to the first embodiment of the present invention.

The function and principle of a reflection phase shifting mask will be described below prior to a description of the first embodiment of the present invention. As shown in FIG. 1, a reflection phase shifting mask is constituted by the following main components: a substrate 12 for obtaining reflected light, a phase shifter 11 for giving a phase difference to the reflected light, and a light transmitting medium 10. Letting $n_0$ be the refractive index of the light transmitting medium, $n_1$ be the refractive index of the phase shifter, and $n_2$ be the refractive index of the substrate, reflection phase shifting masks may have two types of structures represented by the following two inequalities:

(a) $n_1 < n_0 < n_2$     (1)

(b) $n_2 < n_0 < n_1$     (2)

Reflection phase shifting masks are manufactured in accordance with these combinations of refractive indexes. In general, the phase of light is inverted when the light shifts from a medium having a small refractive index to a medium having a large refractive index. Each of FIGS. 2A and 2B show the relationship between the point at which the phase of light is inverted and the film thickness for a phase difference of 180°.

Referring to FIGS. 2A and 2B, each broken line indicates light whose phase is inverted. For example, in FIG. 2A, the phase of light is inverted only when it is reflected by the substrate and the lower surface of the phase shifter, but is not inverted at the upper surface of the phase shifter. For this reason, unlike the light reflected by the substrate, all the light reflected by the phase shifter is inverted. An amplitude reflectance is determined by superposition of the phases of the reflected light beams.

The principle of multiple reflection by a thin film will be briefly described next. Consider the interference effect obtained by superposing the light reflected by an upper surface A of the phase shifting layer on the light reflected by a lower surface B of the phase shifting layer. In this case, incident light is defined by $$\Phi_0 \exp(-i\omega t) \quad (3)$$

The light reflected by the upper surface of the phase shifting layer is defined by $$\Phi(0) = \rho_{21} \Phi_0 \exp(-i\omega t) \quad (4)$$

where $\Phi_0$ is the amplitude and $\rho_{21}$ is the amplitude reflectance arising when incident light in a substance having a refractive index of $n_2$ reflects on a substance having a refractive index of $n_1$. In this case, since the optical distance is represented by $2n_1 d$ when incident light passing through the upper surface A reflects on the lower surface B and returns to the upper surface A, a phase difference $\gamma$ is given by $$\gamma = (2\pi/\lambda) \cdot 2n_1 d = 4\pi n_1 d/\lambda \quad (5)$$

In this case, if the phase difference is allowed to vary within the range of 180°±10°, which is a practical allowable range, a tolerance $\delta$ of a film thickness d is represented by $$\delta = 0.06\lambda/(4n_1) \quad (6)$$

In practice, when the wavelength $\lambda$ is set to be 0.248 μm; and the refractive index $n_1$ of the phase shifter, 1.3, the tolerance $\delta$ is about 2.7 nm.

When the phase difference is allowed to vary within the range of 180°±10°, the tolerance of the refractive index $n_1$ of the phase shifter is represented as follows, provided that the refractive index of the light transmitting medium is represented by $n_0$, and $n_0 < n_1$:

$$\{(H-0.06\ L)/0.94\ L\}n_0 < n_1 < \{(H+0.06\ L)/1.06\ L\}n_0 \quad (7)$$

If $n_0 > n_1$, the directions of the inequality signs are reversed.

Considering that the phase of first reflected light delays with respect to the phase of surface reflected light by $\gamma$, the amplitudes of zeroth, first, and second reflected light components are given as follows:

zeroth: $\rho_{01} \Phi_0$ first: $t_{01} \rho_{12} t_{10} \Phi_0$ second: $t_{01} \rho_{12} \rho_{10} \rho_{12} t_{10} \Phi_0$ where $t_{01}$ is the transmissivity of the light at the time when the light from a substance having a refractive index $n_0$ is transmitted through a substance having a refractive index $n_1$. Therefore, an amplitude $\Phi'$ obtained by superposing the above reflected light is represented by $$\Phi' = [\{t_{01} t_{10} \rho_{12} \exp(i\gamma)\}/\{1+(\rho_{01}\rho_{12})\exp(i\gamma)\}]\Phi_0 \quad (8)$$

If the amplitude of the light reflected by the surface is added to the amplitude $\Phi'$, an amplitude $\Phi''$ of the entire reflected light is given by $$\Phi'' = [\rho_{01} + \{t_{01} t_{10} \rho_{12} \exp(i\gamma)\}/\{1+(\rho_{01}\rho_{12})\exp(i\gamma)\}]\Phi_0 \quad (9)$$

An amplitude reflectance $r$ of the entire film having this structure can be obtained by dividing equation (9) by $\Phi_0$. That is, the following equation can be obtained by using the Fresnel rule.

$$r = \{\rho_{01} + \rho_{12} \exp(i\gamma)\}/\{1+(\rho_{01}\rho_{12})\exp(i\gamma)\} \quad (10)$$

Therefore, a reflectivity R of this film is given by $$R = r^2 = \{\rho_{01}^2 + \rho_{12}^2 + 2(\rho_{01}\rho_{12})\cos\gamma\}/\{1+(\rho_{01}\rho_{12})^2 + 2(\rho_{01}\rho_{12})\cos\gamma\} \quad (11)$$

In this case, the amplitude reflectances $\rho_{01}$ and $\rho_{12}$ are respectively given by $$\rho_{01} = -\rho_{10} = \pm(n_1 - n_0)/(n_1 + n_2) \geq 0 \quad (12)$$

$$\rho_{12} = -\rho_{21} = \pm(n_2 - n_1)/(n_2 + n_1) \geq 0 \quad (13)$$

If the phase delay $\gamma$ due to multiple reflection inside the phase shifting layer is set to be 0 or $\pi$, the above amplitude reflectance formula is simply expressed in two ways:

(P) When $\gamma = 0$, since $\exp(i\gamma) = 1$, $r = (\rho_{01} + \rho_{12})/\{1+(\rho_{01}\rho_{12})\}$.

(Q) When $\gamma = \pi$, since $\exp(i\gamma) = -1$, $r = (\rho_{01} - \rho_{12})/\{1-(\rho_{01}\rho_{12})\}$.

These equations include no imaginary number term due to a phase delay based on an optical distance difference, but include only real number terms.

Consider the relationship between the multiple reflection equations, the film thickness of a phase shifter, and the refractive index in each case.

In case (P), the light beams respectively reflected by the upper and lower surfaces of the phase shifter intensify each other. At this time, the intensity of the light reflected by the phase shifter is maximized. In this case, the phase difference may be set to be $2h\pi$ (h is an integer) for a distance $2n_1 d_p$, where $d_p$ is the film thickness in case (P). That is, $$(2\pi/\lambda) \times 2n_1 d_p = 2h\pi$$

so that the film thickness $d_p$ of the phase shifter having a refractive index $n_1$ is given by $$d_p = \lambda h/(2n_1)$$

In order to satisfy both the conditions that the phase shifter should have the optimal film thickness $d_p$ and the phase difference between light beams respectively reflected by the phase shifter and the substrate should be $\pi$, the phase difference at the time when the light propagates in a light transmitting medium having a refractive index $n_0$ by a distance $2d_p$ may be $(2S+1)\pi$ (where S is an integer). The following two cases (a) and (b) can be considered depending on the magnitudes of the refractive indexes of the light transmitting medium and the substrate:

In case (a), since the phase of the light reflected by the substrate is inverted by $\pi$, the following equation is established:

$$(2\pi/\lambda) \times 2n_0 d_p = 2S\pi$$

Inevitably, $$d_p = \lambda S/(2n_0)$$

therefore, the refractive index $n_0$ of the light transmitting medium is represented by $$n_0 = \lambda S/(2d_p)$$

In case (b), since the phase of the light reflected by the substrate is not inverted, the following equation is established:

$$(2\pi/\lambda) \times 2n_0 d_p = (2S+1)\pi$$

Inevitably, $$d_p = \lambda(2S+1)/(4n_0)$$

therefore, the refractive index $n_0$ of the light transmitting medium is represented by $$n_0 = \lambda(2S+1)/(4d_p)$$

In case (Q), the light beams respectively reflected by the upper and lower surfaces of the phase shifter attenuate each other. At this time, the intensity of the light reflected by the phase shifter is minimized. In this case, the phase difference may be set to be $(2h+1)\pi$ for a distance $2n_1 d_Q$. The following equation is established:

$$(2\pi/\lambda) \times 2n_1 d_Q = (2h+1)\pi$$

so that a film thickness dQ of the phase shifter having a refractive index $n_1$ is given by $$d_Q = \lambda(2h+1)/(4n_1)$$

In order to satisfy both the conditions that the phase shifter should have the optimal film thickness $d_Q$ and the phase difference between light beams respectively reflected by the phase shifter and the substrate should be $\pi$, the following equations may be used with S being an integer, similar to case (P).

In case (a), since the phase of the light reflected by the substrate is inverted, the following equation is established:

$$(2\pi/\lambda) \times 2n_0 d_Q = 2S\pi$$

Inevitably, $$d_Q = \lambda k/(2n_0)$$

therefore, the refractive index $n_0$ of the light transmitting medium is represented by $$n_0 = \gamma k/(2d_Q)$$

In case (b), since the phase of the light reflected by the substrate is not inverted, the following equation is established:

$$(2\pi/\lambda) \times 2n_0 d_Q = (2S+1)\pi$$

Inevitably, $$d_Q = \lambda(2S+1)/(4n_0)$$

therefore, the refractive index $n_0$ of the light transmitting medium is represented by $$n_0 = \lambda(2S+1)/(4d_Q)$$

In either of cases (P) and (Q), the integers h and S are determined such that the relationship in magnitude between refractive indexes satisfies inequality (a) or (b). In practice, these reflectances may be calculated by substituting the refractive indexes at the corresponding wavelengths into the above equations.

The first embodiment of the present invention will be described below with reference to FIG. 1.

First Embodiment

A reflection phase shifting mask according to the first embodiment of the present invention has the arrangement shown in FIG. 1. That is, the reflection phase shifting mask has a substrate 12 for reflecting exposure light, a phase shifting layer 11 formed on a portion on the substrate 12, a light transmitting medium 10 formed on the substrate 12 and the phase shifting layer 11, and a reflection reducing layer 13 formed on the light transmitting medium 10. The thickness of the phase shifting layer 11 is set such that the phase difference between light beams respectively reflected by the substrate 12 and the phase shifting layer 11 becomes about 180°. In addition, the refractive indexes of the phase shifting layer 11 and the light transmitting medium 10 are set such that the phase of light reflected by the phase shifting layer 11 becomes equal to that of light which is transmitted through the phase shifting layer 11, reflected by the substrate 12, and output from the phase shifting layer 11. A reflection reducing layer 14 is added to the lower surface of the substrate 12, as needed.

In this embodiment, materials for the mask were determined under the conditions that exposure light was vertically incident, and the wavelength of the exposure light was 248 nm. Referring to FIG. 1, materials used for the main components of the phase shifting mask were: $SiN_x$ (refractive index $n_2=2.9$) for the substrate 12; $MgF_2$ (refractive index $n_1=1.25$; thickness $d=99$ nm) for the phase shifting layer 11; and $TiO_2$ (refractive index $n_0=2.5$) for the light transmitting medium 10.

A method of manufacturing the mask will be described next. As shown in FIG. 3A, the phase shifting layer 11 (phase shifter) was deposited on the substrate 12 by a reactive sputtering method, a CVD method, or the like such that the thickness d became about 99 nm.

Figure 3B:
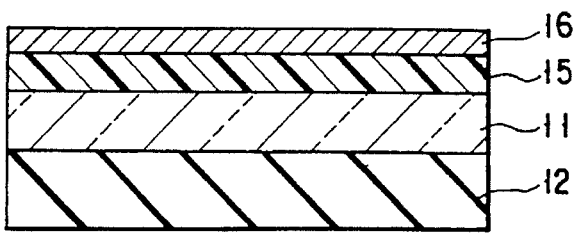
Figure 3C:
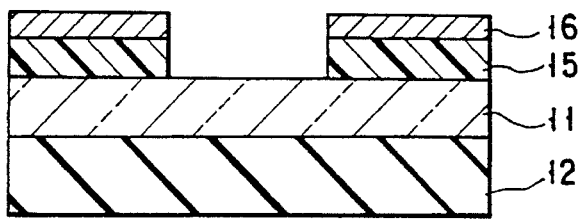

As shown in FIG. 3B, an electron beam resist 15 was coated on the resultant structure to have a thickness of 0.5 μm. A conductive film 16 was then formed on the electron beam resist 15 to have a thickness of 0.2 μm. Patterning was performed on the conductive film 16 by using an electron beam at an energy of 3 μC/cm². Thereafter, development was performed. As a result, a pattern was formed on the resist, as shown in FIG. 3C.

Figure 3D:
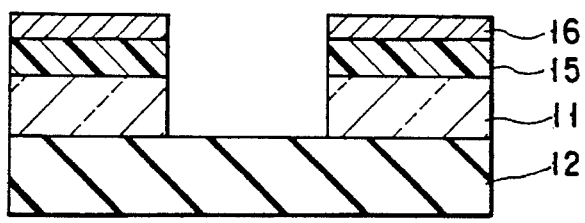

Subsequently, dry etching was performed by using the resist pattern as a mask to remove a portion, of the phase shifting layer 11, which was exposed from the resist pattern, thereby forming a stepped portion on the phase shifting layer 11, as shown in FIG. 3D.

Figure 4A:
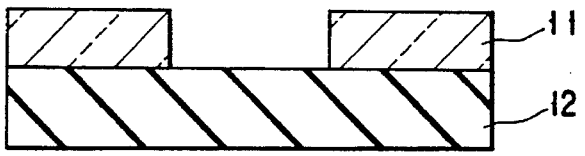
FIGS. 4A to 4C are sectional views of the reflection phase shifting mask, showing the second half of the manufacturing process according to the first embodiment.
Figure 4B:
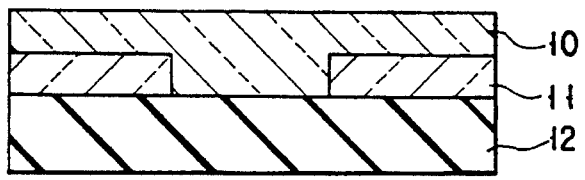
Figure 4C:
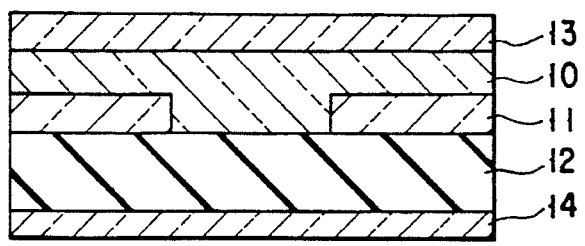

As shown in FIG. 4A, the resist 15 was removed. Furthermore, as shown in FIG. 4B, the light transmitting medium 10 was formed on the entire surface of the resultant structure by reactive sputtering. The surface of the light transmitting medium 10 was polished by a flat plate to have a flat surface. As shown in FIG. 4C, in this embodiment, in order to suppress surface reflection, the reflection reducing layer 13 was formed on the light transmitting medium 10, and the reflection reducing layer 14 was formed on the lower surface of the substrate 12. The reflection reducing layers 13 and 14 played important roles in taking a sufficient amount of exposure light in the mask and removing incoherent light which is unnecessary for interference.

The reflection phase shifting mask was obtained in this manner. In this case, as each of the reflection reducing layers 13 and 14, a layer is preferably used, which has an optical thickness of $\lambda/4$ and a refractive index of $(n_A \times n_B)^{1/2}$ where $n_A$ and $n_B$ are the refractive indexes of two substances having a boundary surface therebetween. Therefore, the optimal material for each reflection reducing layer is one which exhibits a refractive index of about 1.58 at the upper surface and an index of about 1.70 at the lower surface when the thickness is about 49.6 nm. In this embodiment, as a material for the reflection reducing layers 13 and 14 on the upper and lower surfaces, $Al_2O_3$ (refractive index=1.62) was used. This reflection reducing layer material is not limited to $Al_2O_3$, and $SiO_2$, $CaF_2$, or the like may be used. In addition, the reflection reducing layer is not limited to a single-layered structure, and a multilayered structure may be employed.

In this case, the set of refractive indexes is equivalent to case (a). In case (P), the thickness $d_p$ is determined to satisfy $d_p=\lambda h/(2n_1)$. In this embodiment, $d_p=\lambda/2.5$ was set with $n_1=1.25$ and $h=1$. In this case, the amplitude reflectance was about 39%.

If the phase shifter thickness d is set to be $d'=\lambda/6$ in this structure, the resultant structure corresponds to case (Q). In this case, since the phases of light beams subjected to multiple reflection in the phase shifter cancel each other, the reflectance of the entire phase shifter becomes lower than that in case (P). In this case, the amplitude reflectance is about 26%.

By using the mask manufactured in this embodiment, a 0.3-μm wide pattern was repeatedly exposed, with KrF exposure light, on a wafer on which a 1.0-μm thick SNR resist available from Shipley was coated. The depth of focus was 1.6 μm, which is desirably 1.0 μm.

As described above, according to this embodiment, since the reflection phase shifting mask is constituted by the phase shifting layer 11, the light transmitting medium 10, and the reflection reducing layers 13 and 14 which are formed on the substrate 12, attenuation of transmitted light, which occurs when light having a short wavelength is used for exposure, can be reduced. In addition, the mask can be easily manufactured by properly selecting refractive indexes of the light transmitting medium 10 and the phase shifting layer 11. Furthermore, with the reflection reducing layers 13 and 14 formed to remove light components which are unnecessary for interference, incoherent light components can be removed, which is a merit that a transmission phase shifting mask does not have. With this merit, an increase in resolution with a decrease in bias can be expected.

The present invention is not limited to the above-described embodiment. In the embodiment, an oxide, a nitride, and a fluoride such as $SiN_x$, $MgF_2$, $TiO_2$, and $Al_2O_3$ are used as materials for the substrate and the phase shifter. However, other materials such as GaAsO, $CrO_2$, $ZrO_2$, ZnS, $TiO_2$, $CeF_3$, or LiF may be used.

Second Embodiment

Prior to a description of the second embodiment of the present invention, the function and principle of a reflection phase shifting mask of the present invention will be described next. Surface reflection on a thin film will be briefly described first. The phase difference between light beams respectively reflected by the upper surfaces of a reflective material and a phase shifting layer is determined by the optical constants of the respective materials because the optical path differences are the same. In this case, the optical constants are defined as follows:

optical constant of reflective material:

$$<N_x>=n_x-ik_x \quad (x=1, 2) \tag{32}$$

optical constant of light transmitting medium:

$$<N_a>=n_a-ik_a \tag{33}$$

Consider the interference effect of the light beams respectively reflected by the upper surfaces of the reflective material and the phase shifting layer. Letting $\rho_x$ (x=1, 2) be the reflectance at the surface of each reflective material, $\rho_x$ is expressed as follows:

$$\rho_x=(<N_x>-<N_a>)/(<N_x>+<N_a>)=\{(n_x-n_a)-i(k_x-k_a)\}/\{(n_x+n_a)-i(k_x+k_a)\} \tag{34}$$

In this case, a phase $\theta_x$ (x=1, 2) appearing at the time of reflection on each reflective material is expressed as follows:

$$\theta_x=\tan^{-1}(b_x/a_x) \tag{35}$$

for $$a_x=n_x^2-n_a^2+k_x^2-k_a^2 \tag{36}$$

$$b_x=2(n_x k_a-n_a k_x) \tag{37}$$

Therefore, a phase difference Δ obtained by the reflective material and the phase shifting layer is expressed as follows:

$$\Delta = \theta_1 - \theta_2 = \tan^{-1}(b_1/a_1) - \tan^{-1}(b_2/a_2) \quad (38)$$

(for −90°<θ_x<90°)

When an extinction coefficient $k_a$ of the light transmitting medium is given as $k_a=0$, the values $a_x$ and $b_x$ in the above equations are represented by $$a_x = n_x^2 + k_x^2 - n_a^2 \quad (39)$$

$$b_x = 2n_a k_x \quad (40)$$

In this case, a reflectivity $R_x$ (x=1, 2) is represented by $$R_x = \{(n_x - n_a)^2 + k_x^2\} / \{(n_x + n_a)^2 + k_x^2\} \quad (41)$$

In order to set Δ=180°, (θ_1, θ_2)=(≑90, ≑−90) or (≑−90, ≑90) must be set. In this case, the symbol "≑" indicates that the value of the left-hand side is limitlessly close to the value of the right-hand side.

This can be achieved provided that $$n_x^2 + k_x^2 \doteq n_a^2 \;(x=1,\,2)\; n_1^2 + k_1^2 < n_a^2 < n_2^2 + k_2^2 \quad (42)$$

That is, a material which can satisfy these conditions may be selected.

In this case, if the relationship between the reflectivities of the reflective material and the phase shifting layer is close to $|R_1 - R_2| \doteq 0$, the mask has characteristics similar to those of a transmission shifter edge type mask. If the above relation is close to $|R_1 - R_2| \gg 0$, the mask may have characteristics similar to those of a transmission halftone type mask. In this case, in order to obtain a high reflectivity, a material having a small refractive index and a large extinction coefficient is preferably used.

Furthermore, in order to make the phase $\theta_x$ as close to 90° as possible, a material is selected to minimize a difference D between the squares of the optical constants $(D=(n_1^2+k_1^2)-(n_2^2+k_2^2))$. The extinction coefficient $k_a$ of the light transmitting medium is preferably set to be $k_a=0$ to prevent attenuation of exposure light.

Figure 12:
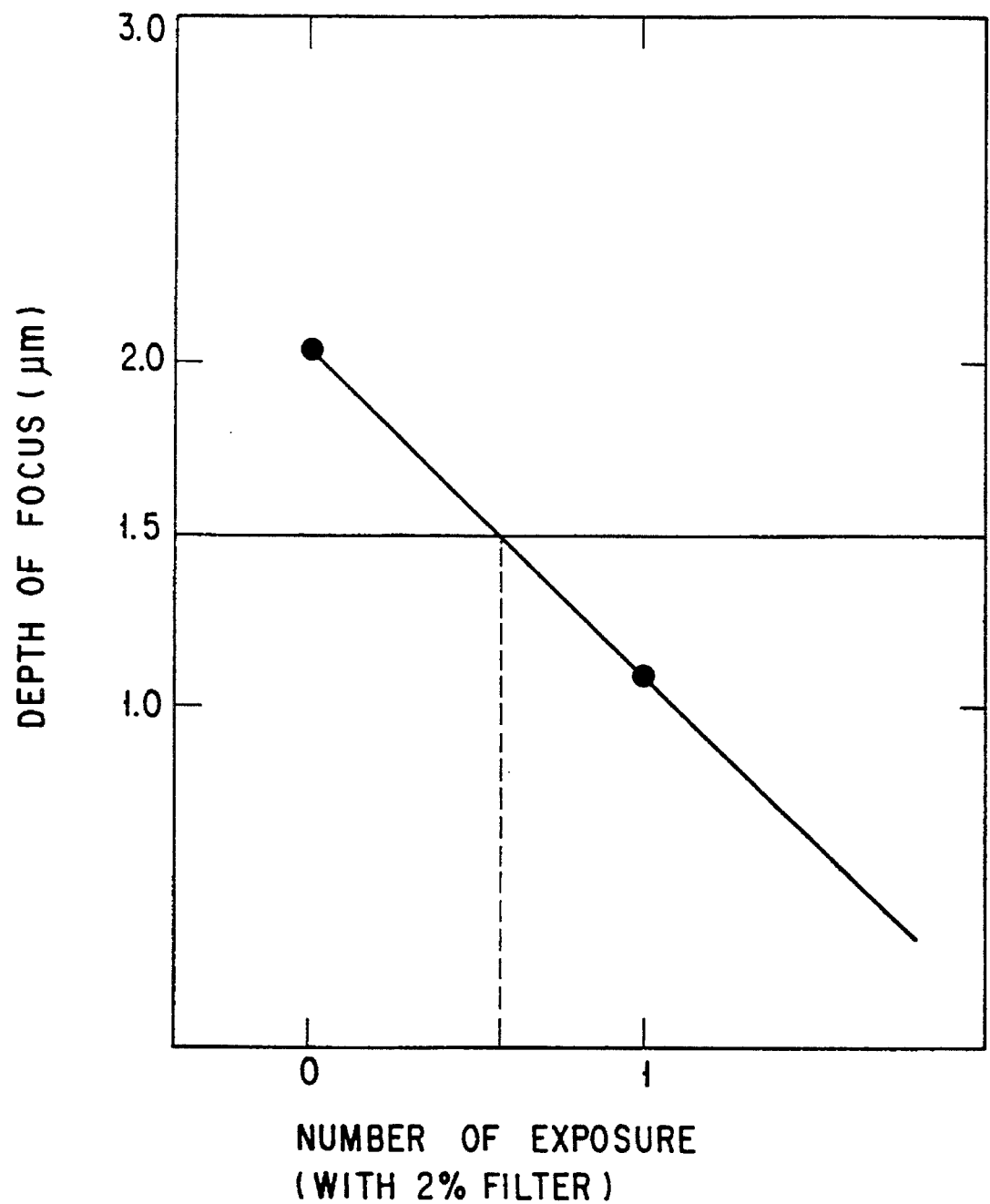
FIG. 12 is a graph showing the result of an experiment on reflectance and depth of focus.

If the refractive index $n_a$ of the light transmitting medium is large, a reflection reducing layer is preferably formed to suppress reflection on the surface of the medium. A reflection reducing layer having a reflectivity of 1% or less is preferably formed. The value "1% or less" is based on the following experiment. A resist pattern was actually formed by exposure. Exposure was performed again with respect to the resist pattern by using a filter having a transmissivity of 2%. More specifically, a pattern having a line width of 0.6 μm and a line interval of 0.6 μm was exposed on an Si wafer on which a photoresist GX250 (available from Japan Synthetic Rubber) having a thickness of 1.3 μm was coated. The exposure conditions were: wavelength=0.436 μm, NA=0.54, and o=0.5. FIG. 12 shows the result. As is apparent from this result, if the depth of focus is allowed up to 1.5 μm, blurring of light (reflection) is allowed up to 1%.

The second embodiment of the present invention will be described next with reference to the accompanying drawings. As shown in FIG. 6D, in a reflection phase shifting mask of this embodiment, a reflective material 62 and a phase shifter material 64 are alternately formed on the surface of a substrate 61 to have the same thickness. A light transmitting medium 65 is formed on the material layers 62 and 64, as needed. In addition, a reflection reducing layer 66 is formed on the light transmitting medium 65. Materials to be used vary depending on the wavelength of exposure light, and will be described in detail later as embodiments.

A method of manufacturing the mask of this embodiment will be described first. FIGS. 5A to 5D and 6A to 6D are sectional views for explaining the principle of the mask manufacturing method of the present invention. First of all, as shown in FIG. 5A, the reflective material 62 was uniformly and flatly formed on the substrate 61 by sputtering or vapor deposition.

As shown in FIG. 5B, a resist 63 was coated on the reflective material 62, and a resist pattern was partly formed on the substrate 61 upon patterning and development. Thereafter, as shown in FIG. 5C, the reflective material 62 is selectively removed by etching or the like using the resist pattern 63 as a mask. As shown in FIG. 5D, the resist 63 is removed, and the pattern made of the reflective material was formed on the substrate 61.

Figure 6A:
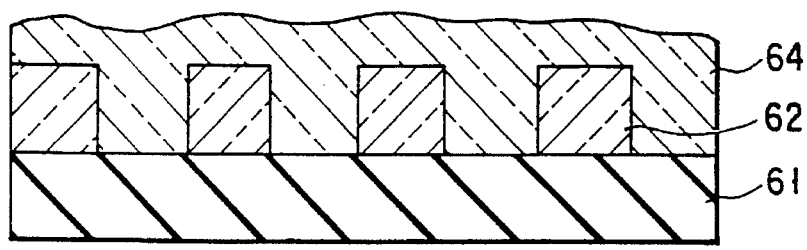
FIGS. 6A to 6D are sectional views of the reflection phase shifting mask, showing the second half of the manufacturing process according to the second embodiment.
Figure 6B:
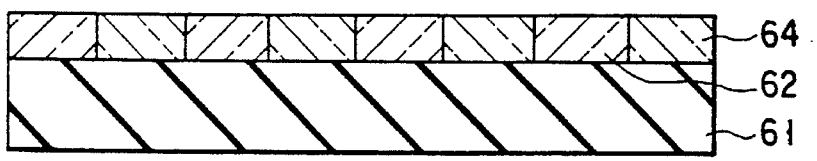

Subsequently, as shown in FIG. 6A, the surface reflection phase shifter material 64 was deposited on the entire surface of the substrate 61 having the pattern constituted by the reflective material 62. As shown in FIG. 6B, the surface of the phase shifter material 64 is flattened by polishing or the like and is planed to expose the reflective material 62. With this process, the surface reflection phase shifting mask having both the reflective material 62 and the phase shifter material 64 on its surface was formed. In this case, materials used as the reflective material 62 and the surface reflection phase shifter material 64 are determined by the optical constants of the respective materials at the wavelength of exposure light.

Figure 6C:
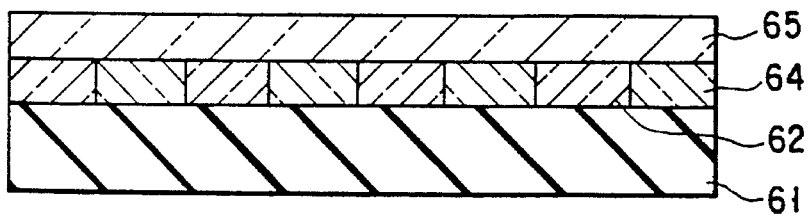
Figure 6D:
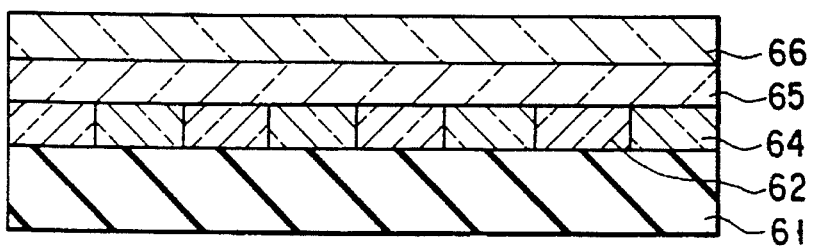

As shown in FIG. 6C, the light transmitting medium 65 may be formed on the surface of the resultant structure depending on the optical constants of materials to be used. In addition, as shown in FIG. 6D, the light transmitting medium 65 and the reflection reducing layer 66 may be formed on the surface.

The embodiment will be described in more detail below.

A case wherein the above embodiment is applied to a mask using a fluorine excimer laser having an exposure wavelength of 157 nm will be described first.

In this case, materials used for the main components were: Au (refractive index=1.49; extinction coefficient=1.11) for the reflective material 62; Al (refractive index=0.08; extinction coefficient=1.68) for the phase shifter material 64; and SiO_2 (refractive index=1.69; extinction coefficient=0.00) for the light transmitting medium 65. In this case, the reflectances of the reflective material 62 and the surface reflection phase shifter material 64 were 11.4% and 90.9%, respectively. Furthermore, a phase difference of about 171.6° was obtained.

In this case, $SiO_2$ was used as the material for the light transmitting medium 65. However, a material whose extinction coefficient with respect to exposure wavelength is as close to 0 as possible, for example, a fluoride such as LiF or $MgF_2$ may be used. Alternatively, Al, Si, Ni, Ge, PbS, Sb, InSb, Cu, Rh, Ag, a compound thereof, or a mixed crystal thereof may be used.

Another case wherein the above embodiment is applied to a mask using an ArF excimer layer having an exposure wavelength of 193 nm will be described next.

In this case, materials used for the main components were: Al (refractive index=1.10; extinction coefficient=1.81) for the reflective material 62; Mg (refractive index=0.21; extinction coefficient=1/40) for the phase shifter material 64;

and $SiO_2$ (refractive index=1.56; extinction coefficient= 0.00) for the light transmitting medium 65. In this case, the reflectances of the reflective material 62 and the surface reflection phase shifter material 64 were 89.7% and 84.4%, respectively. Furthermore, a phase difference of about 165.8x was obtained.

In this case, $SiO_2$ was used as the material for the light transmitting medium. However, a nitride such as $Si_3N_4$ or a fluoride such as LiF or $MgF_2$ may be used in place of $SiO_2$. Alternatively, Al, Ni, PbS, Rh, Sb, PbTe, a compound thereof, or a mixed crystal thereof may be used.

Figure 7:
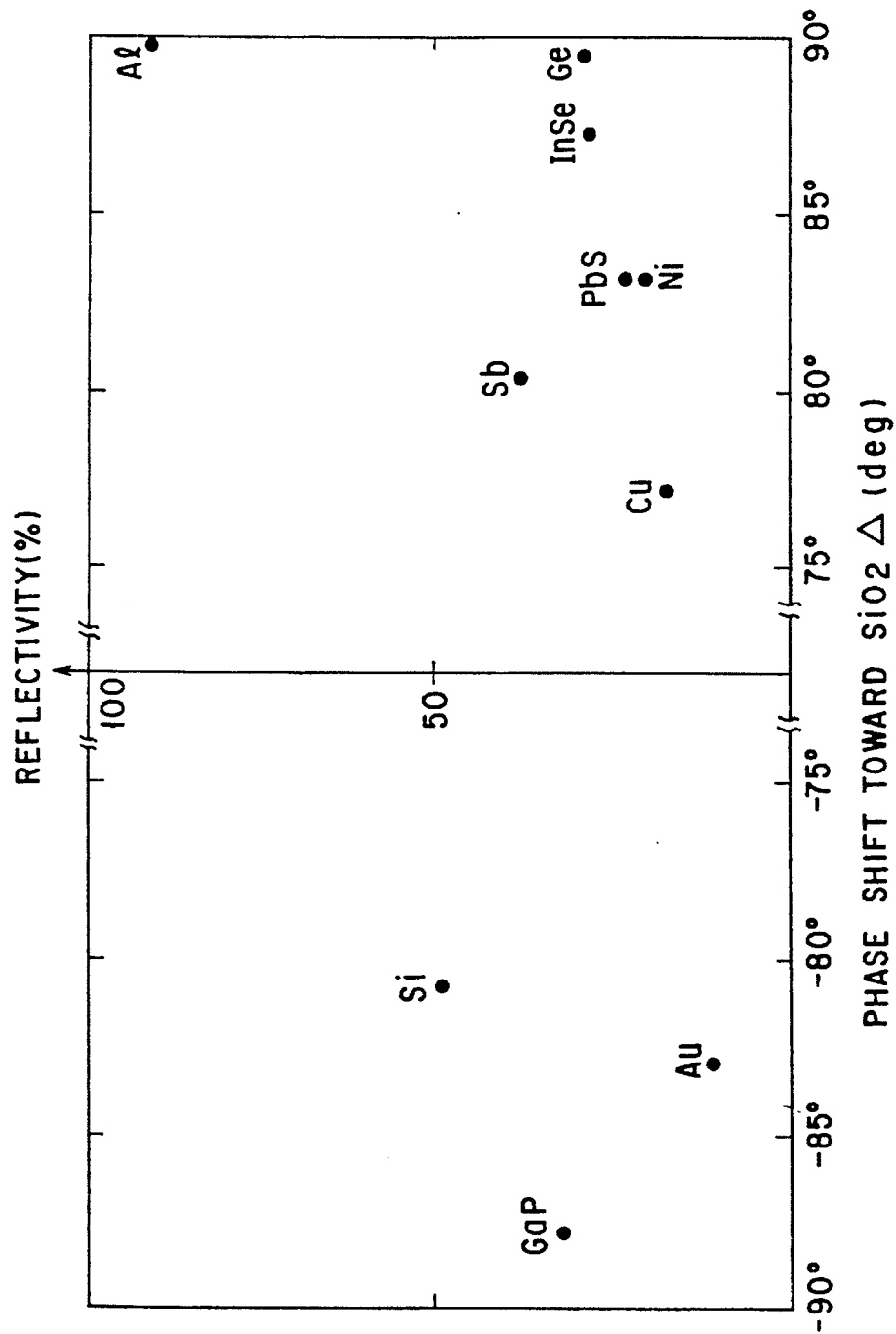
FIG. 7 is a graph showing the relationship between phase differences occurring between a light transmitting medium and various reflective materials and the reflectivities in a case wherein SiO$_2$ is used for the light transmitting medium, and light having a wavelength of 157 nm is used as exposure light.
Figure 8:
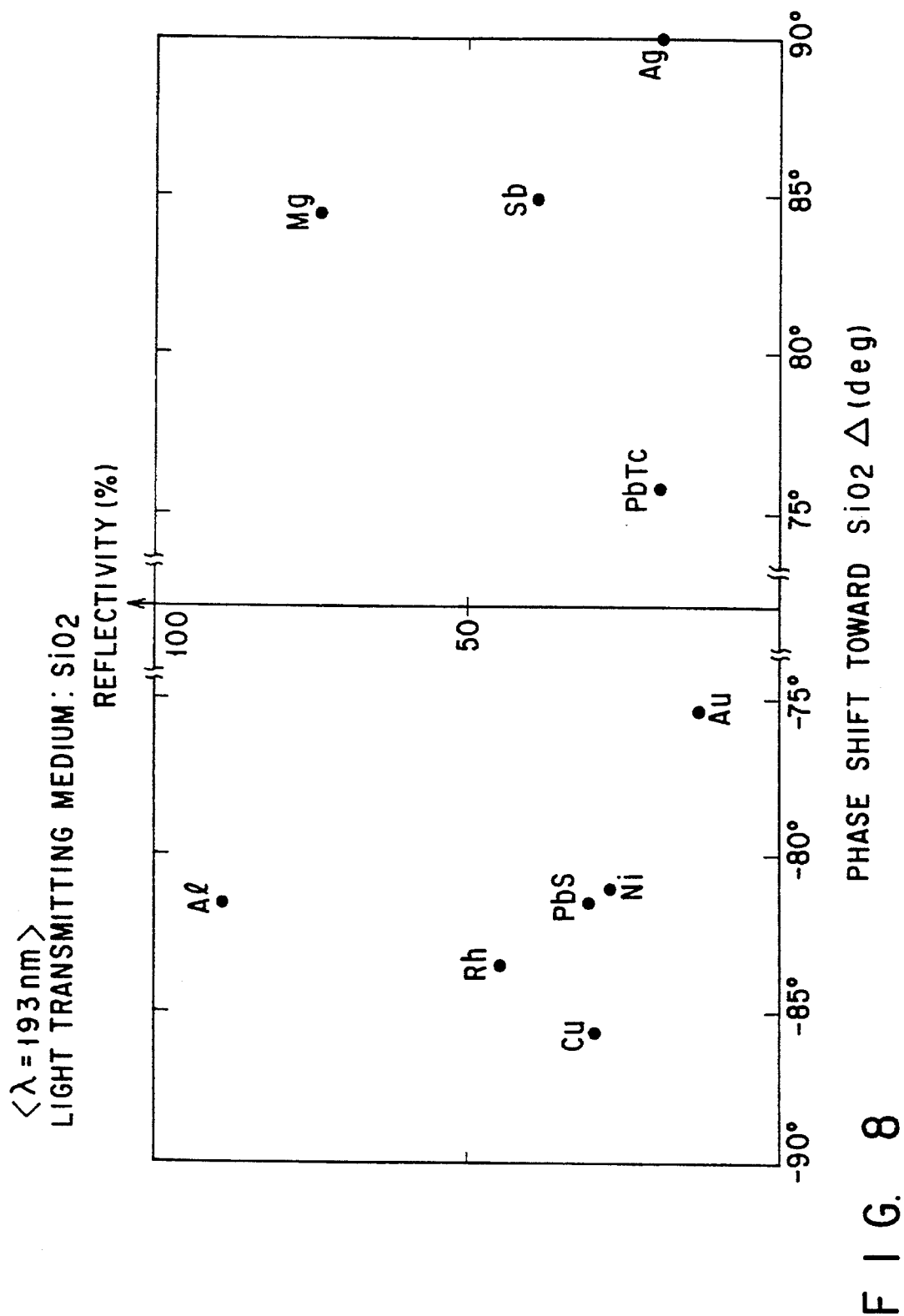
FIG. 8 is a graph showing the relationship between phase differences occurring between a light transmitting medium and various reflective materials and the reflectivities in a case wherein SiO$_2$ is used for the light transmitting medium, and light having a wavelength of 193 nm is used as exposure light.
Figure 9:
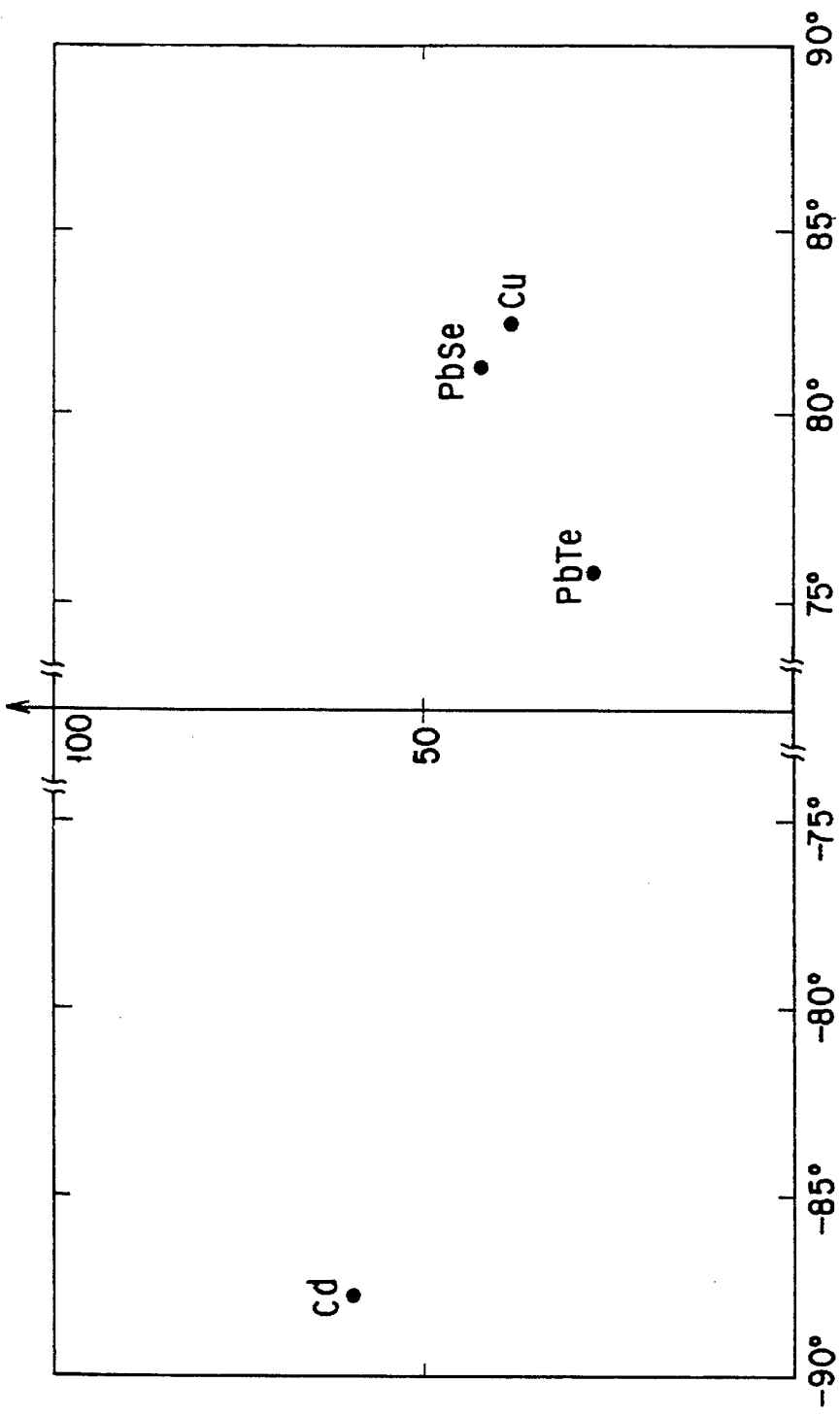
FIG. 9 is a graph showing the relationship between phase differences occurring between a light transmitting medium and various reflective materials and the reflectivities in a case wherein SiO$_2$ is used for the light transmitting medium, and light having a wavelength of 248 nm is used as exposure light.

The surface reflection phase shifting mask was obtained by the above-described method. A surface reflection phase shifting mask can also be obtained by a combination of materials other than those described above. FIGS. 7 to 9 show materials which could be useful at the respective exposure wavelengths when a light transmitting medium is made of $SiO_2$. Phase inversion of each material depends on the refractive index of a light transmitting medium used. Therefore, in order to select a material for a light transmitting medium, we should pay attention to choose materials exhibiting large phase differences (materials located on two end sides in each figure), and the reflectances of the respective materials are then compared with other to select a material which can satisfy both the conditions associated with transmissivity and phase difference. The resultant mask can be used as a halftone or Levenson type mask depending on the relationship between reflectances.

The following table (Table 1) shows the optical constants of applicable materials to the present invention at the respective wavelengths.

TABLE 1

|  | 157 nm | | 193 nm | | 248 nm | |
| --- | --- | --- | --- | --- | --- | --- |
|  | n | k | n | k | n | k |
| Al | 0.08 | 1.68 | 0.10 | 1.81 | 0.17 | 2.70 |
| Ba | 0.63 | 0.20 | 0.53 | 0.54 | 0.61 | 0.87 |
| Cd | 0.46 | 0.69 | 0.40 | 1.00 | 0.40 | 1.52 |
| Cr | 0.90 | 0.54 | 2.23 | 1.17 |  |  |
| Cu | 1.00 | 1.03 | 0.90 | 1.40 |  |  |
| Au | 1.47 | 1.11 | 1.43 | 1.15 | 1.41 | 1.35 |
| Mg | 0.19 | 1.10 | 0.21 | 1.40 |  |  |
| Si | 0.67 | 1.85 | 0.78 | 2.40 | 1.70 | 3.38 |
| Ag | 0.95 | 0.76 | 1.05 | 1.14 | 1.39 | 1.34 |
| Rh | 0.71 | 1.07 | 0.67 | 1.60 | 0.79 | 2.34 |
| Ni | 1.01 | 1.17 | 1.01 | 1.46 | 1.40 | 2.10 |
| Ge | 0.92 | 1.40 | 1.10 | 2.10 | 1.39 | 3.20 |
| GaP | 0.90 | 1.50 | 1.20 | 1.84 | 2.37 | 4.19 |
| Sb | 0.65 | 1.30 | 0.63 | 1.30 | 0.60 | 1.20 |
| InSb | 0.90 | 1.35 | 1.10 | 1.75 |  |  |
| PbS | 0.96 | 1.20 | 0.95 | 1.49 |  |  |
| PbTe | 0.75 | 0.85 | 0.90 | 0.94 | 0.72 | 1.00 |
| PbSe | 0.71 | 0.62 | 0.65 | 0.80 | 0.54 | 1.20 |
| Cubic Carbon | (3.26 | 0.68) | 2.94 | 0.01 | 2.65 | 0.00 |
| $SiO_2$ | 1.69 | 0.00 | 1.56 | 0.00 | 1.51 | 0.00 |
| LiF | 1.49 | 0.00 | 1.44 | 0.00 | 1.42 | 0.00 | n: Refractive Index, k: Extinction Coefficient

As described above, according to this embodiment, a decrease in resolution which is caused when light having a short wavelength is used for exposure can be suppressed. In addition, a photomask can be easily manufactured by properly selecting refractive indexes and extinction coefficients. Furthermore, since the phase difference is not dependent on the layer thickness formed by etching, phase difference variations in the overall mask due to etching can be reduced.

Third Embodiment

The third embodiment of the present invention will be described next with reference to FIG. 10. FIG. 10 shows a pattern transfer apparatus constituted by a reflection mask 71 having a liquid crystal arranged in a cell structure, a pattern generator 76 for generating desired pattern information, a liquid crystal control section 75 for controlling the reflection mask 71 on the basis of a signal from the pattern generator 76, an illumination optical system 72 for radiating light on the reflection mask 71, a mirror 73 for reflecting light reflected by the reflection mask 71, and a stage 74 for receiving light reflected by the mirror 73.

This embodiment is characterized in that a liquid crystal is used as a material whose optical characteristics with respect to an exposure wavelength can be changed in accordance with an external signal. FIG. 11 is a schematic sectional view of a mask on which a desired pattern is formed in accordance with an external signal. Elements 81 whose optical characteristics can be changed in accordance with an external signal are arranged in the form of cells, and a wiring layer 82 for transmitting an external signal to each element 81 is formed under the elements 81. The wiring layer 82 transmits a signal from a pattern generator 83 to each element 81 so that the reflectance of each element 81 can be independently changed.

Light is radiated on this mask, and light reflected by each element 81 is transferred onto a wafer. Therefore, a desired pattern can be accurately transferred onto the wafer without transferring images of lines and electrodes, used to transmit external signals to the mask, onto the wafer. In a projection optical system, with a decrease in wavelength of exposure light, distortion of a lens is caused by heat upon absorption of light. With the use of a reflection optical system, however, this problem can be solved.

The operation of the pattern transfer apparatus using this mask will be described with reference to FIG. 10. The reflection mask 71 having the liquid crystal arranged on the cells is connected to the pattern generator 76 via the liquid crystal control section 75. The pattern generator 76 allows the operator to input information corresponding to a pattern to be transferred onto a wafer. By only inputting an arbitrary pattern to the pattern generator 76, the corresponding information is sent to the reflection mask 71. Light radiated from the illumination optical system 72 is reflected by the reflection mask 71 to be transferred on the wafer on the stage 74 via the mirror 73.

In this apparatus, a mask having a desired pattern can be formed by only inputting the corresponding data to the reflection mask 71. Therefore, there is no need to manufacture a mask for each transfer step. In addition, unlike in the use of a liquid crystal as a transmission mask, a desired pattern can be accurately formed on the wafer or substrate having a photosensitive resin film without transferring images of lines, used to send pattern information to the mask, onto the wafer.

As described above, according to this embodiment, a desired pattern can be accurately transferred onto a wafer by using a mask, formed by supplying an external signal corresponding to the desired pattern, in combination with a reflection optical system. In addition, since reflected light is used instead of transmitted light, there is no possibility that light is attenuated and the phase is changed under the influences of lines and electrodes in the mask.

Fourth Embodiment

The fourth embodiment of the present invention will be described with reference to FIG. 10. A reflection mask 71 having a ferromagnetic body formed on cells is connected to a pattern generator 76 through a magnetic field control section 75. The pattern generator 76 is designed to input information corresponding to a pattern to be transferred onto a wafer. Only when an arbitrary pattern is input to the pattern generator 76, information representing whether a magnetic field is applied to each ferromagnetic cell can be transmitted. Light radiated from an illumination optical system 72 is reflected by the reflection mask 71 through a linear polarization filter A (not shown). The linear polarization filter A is arranged between the illumination optical system 72 and the reflection mask 71. The light reflected by the reflection mask 71 is transferred onto a wafer on a stage 74 by a mirror 73 through a linear polarization filter B (not shown) having a polarization direction perpendicular to that of the linear polarization filter A. The linear polarization filter B is arranged between the reflection mask 71 and the mirror 73. A magnetic field applied to the cell is set to rotate through 90° with respect to the incident polarized light. According to this apparatus, only when data is input to the reflection mask 71, a mask having a desired pattern can be formed, and the mask need not be manufactured for each transfer process. In addition, unlike in the use of the liquid crystal as a transmission mask, a wiring layer for transmitting pattern information to a mask will not be transferred, and a desired pattern can be accurately formed on a substrate on which a photosensitive resin material is formed.

Fifth Embodiment

The fifth embodiment of the present invention will be described below. A resist pattern was formed on a substrate having a 1.0-µm thick resist film using a reflection mask of the first embodiment and an ArF excimer laser exposure apparatus of a reflection optical system (NA=0.45, o=0.5). In a pattern having a line width of 0.20 µm and a line interval of 0.20 µm, a depth of focus was obtained to be 0.6 µm. In this embodiment, the exposure apparatus of the reflection optical system was used. However, a refraction optical system may be used as an illumination optical system or a focusing optical system, depending on exposure wavelengths.

Prior to a description of the sixth to seventeenth embodiments of the present invention, the function and principle of the present invention will be described below. In general, a complex index N of refraction of a material can be expressed by $$N = n - k \quad (51)$$

where n is the refractive index of the material, k is the extinction coefficient, and i is an imaginary unit.

Figure 21:
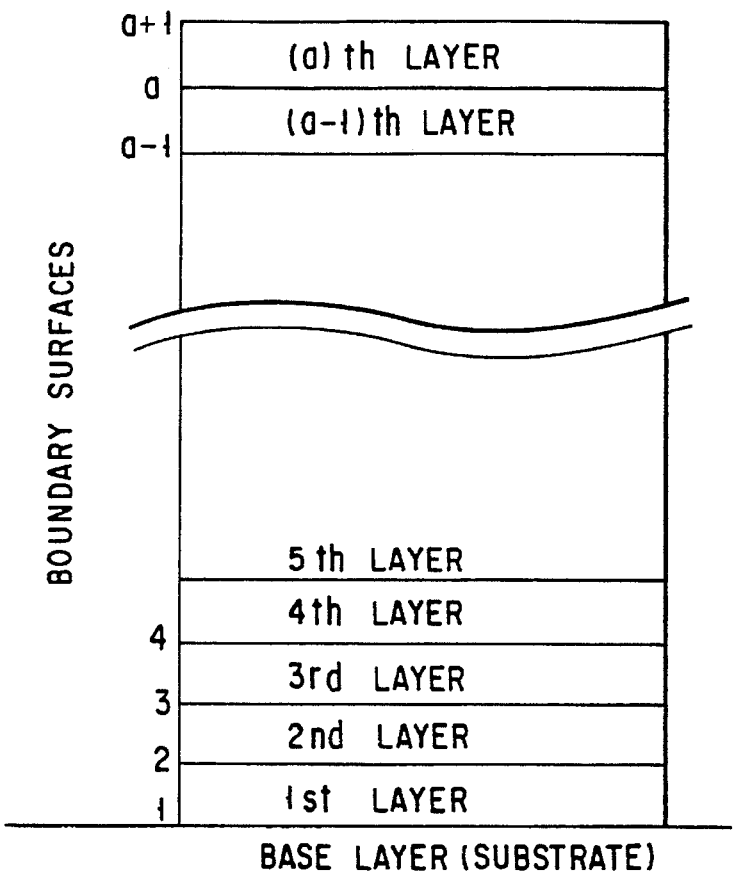
FIG. 21 is a chart for explaining the function of the present invention, showing a case wherein a multilayered film is formed.

Consider a-layered film like the one shown in FIG. 21. The amplitude reflectance of the first layer is represented by $$R_1 = \{r_2 + r_1 \cdot \exp(-1\delta_1 i)\} / \{1 + r_2 \cdot r_1 \cdot \exp(-2\delta_1 i)\} \quad (52)$$

where $r_1$ and $r_2$ are Fresnel reflection coefficients of boundary surfaces 1 and 2, respectively. These coefficients $r_1$ and $r_2$ are respectively given by the following equations:

$$r_1 = (N_1 - N_0)/(N_1 + N_0) \quad (53)$$

$$r_2 = (N_2 - N_1)/(N_2 + N_1) \quad (54)$$

In addition, in equation (52), $2\delta_1$ is the phase difference between adjacent light beams of light beams subjected to multiple reflection in a thin film, and $\delta_1$ is given by $$\delta_1 = 2\pi \cdot N_1 \cdot d_1 / \lambda \quad (55)$$

where $d_1$ is the thickness of the film, and $\lambda$ is the wavelength of incident light.

Provided that the first layer is regarded as a signal boundary having the reflectance (effective Fresnel coefficient) represented by equation (52), the reflectance of the second layer is given by $$R_2 = \{r_3 + R_1 \cdot \exp(-2\delta_2 i)\} / \{1 + r_3 \cdot R_1 \cdot \exp(-2\delta_2 i)\} \quad (56)$$

where $r_3$ is the Fresnel reflection coefficient of a boundary surface. This coefficient $r_3$ is given by the following equation:

$$r_3 = (N_3 - N_2)/(N_3 + N_2) \quad (57)$$

In equation (56), $2\delta_2$ is the phase difference between adjacent light beams of light beams subjected to multiple reflection in the second layer, and $\delta_2$ is given by $$\delta_2 = 2\pi \cdot N_2 \cdot d_2 / \lambda \quad (58)$$

where $d_2$ is the thickness of the second layer.

By sequentially performing such a procedure up to the uppermost layer, an amplitude reflectance $R_a$ of the multi-layered film can be obtained. A reflectivity R can be given by $$R = |R_a|^2 \quad (59)$$

This value R, however, decreases, and reflection is reduced as the optical thickness of the thin film approaches $\lambda/4$.

Figure 22A:
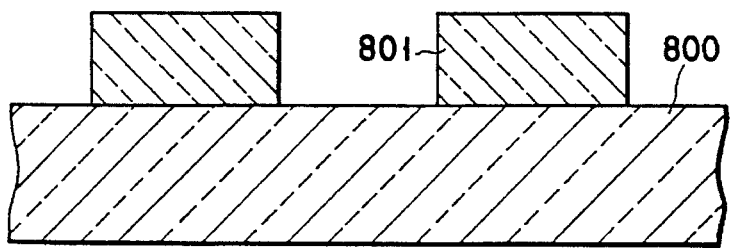
FIGS. 22A and 22B are views respectively showing the arrangement of an exposure mask having a reflection reducing layer with a single-layered structure, and the relationship between the refractive indexes of the substrate and air.

An exposure mask to which the present invention is applied will be described next. FIG. 22A shows a mask having a translucent film 801 formed on the surface of a transparent substrate 800. An amplitude reflectance (Fresnel reflection coefficient) r of the boundary surface between the translucent film 801 and air is represented by $$r = (N_1 - N_0)/(N_1 + N_0) \quad (60)$$

Figure 22B:
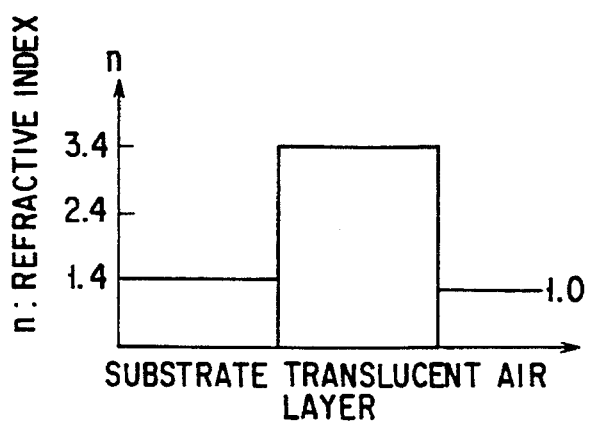

The reflectance is represented by $r^2$. In this case, a high reflectance is obtained when $|N_1 - N_0|$ is large and $|N_1 + N_0|$ is small in equation (60). In contrast to this, when $|N_1 - N_0|$ is small and $|N_1 + N_0|$ is large, a low reflectance is obtained. In general, the material used for the translucent film 801 has a refractive index $N_1$ larger than a refractive index $N_0$ of the air. For this reason, if the translucent film 801 has a single-layered structure as shown in FIG. 22A, the difference in refractive index between the translucent film 801 and the air becomes large, and the reflectance also becomes large, as shown in FIG. 22B. In order to suppress an increase in reflectance, $|N_1 - N_2|$ must be small, and the refractive index of the translucent film 801 is preferably made to be close to the refractive index of the air. However, the refractive index of the translucent film 801 cannot be simply reduced because this refractive index is also associated with phase and transmissivity.

Figure 23A:
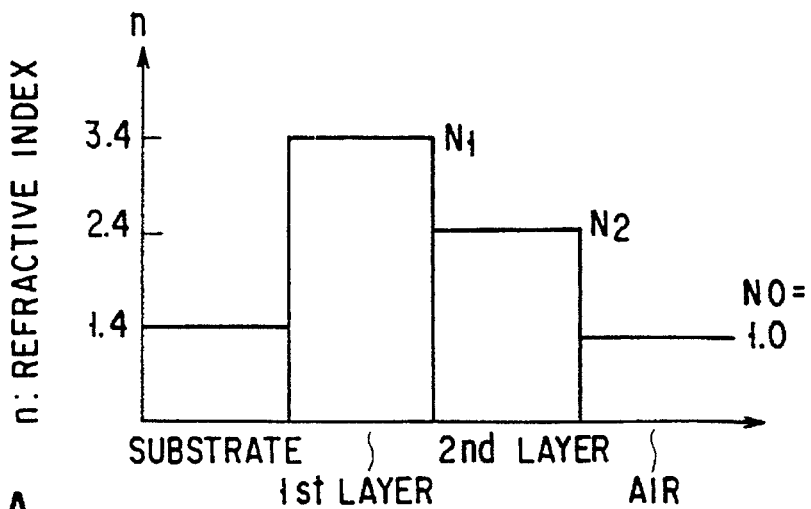
FIGS. 23A to 23C are views respectively showing the arrangement of an exposure mask of the present invention having a reflection reducing layer with a multilayered structure, and the relationship between the refractive index distribution of the exposure mask.

For this reason, a multilayered film is formed as follows. As shown in FIG. 23A, a second translucent film made of a material having a complex index $N_2$ of refraction intermediate between the refractive index $N_0$ of the air and the refractive index $N_1$ of the first translucent film is inserted between the air and the first translucent film. By forming a translucent film having a two-layered structure in this manner, a decrease in reflectance can be achieved. Similarly, if a third translucent film of a complex index of refraction intermediate between the air and the second translucent film is formed therebetween, the reflectance can further decreased. In this case, the second and third translucent films may be adjusted such that their reflectances fall between the refractive index of the first translucent film and the refractive index of the air.

Figure 23B:
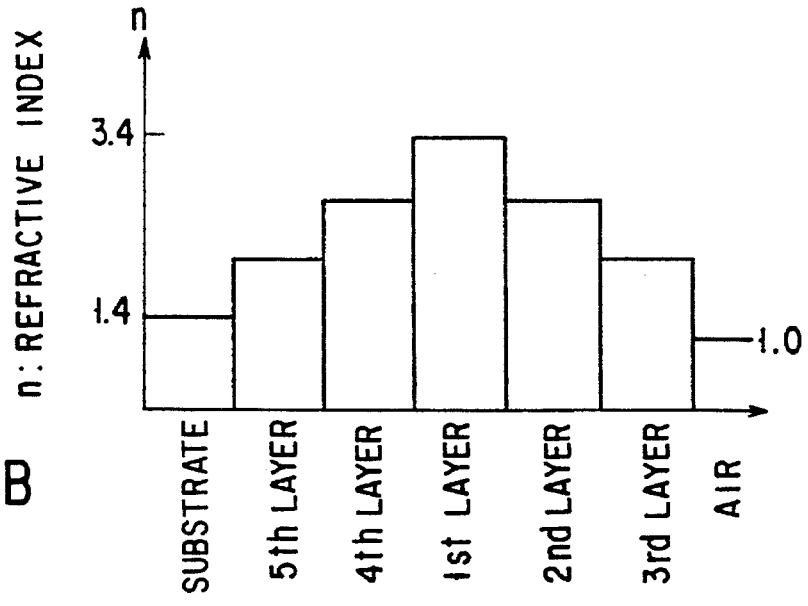

In addition, if a fourth translucent film having a complex index of refraction intermediate between the complex index $N_1$ of refraction and the complex index of refraction of the substrate is formed between the substrate and the first translucent film, reflection of light incident from the substrate side can be reduced. Furthermore, if a fifth translucent film of a refractive index intermediate between the fourth translucent film and the substrate is formed between the substrate and the fourth translucent film, the reflectance can be further decreased. FIG. 23B shows an example of this structure. In this example, translucent regions are constituted by a plurality of thin films, and the refractive indexes of these thin films become gradually larger from the substrate side in the stacking direction of the thin films, reach the maximum at the middle portion, and become gradually smaller afterward.

Figure 23C:
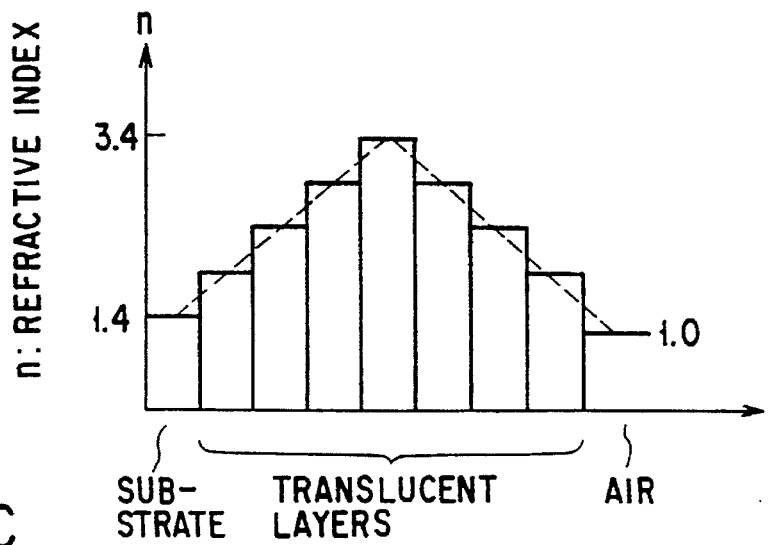

In addition, as shown in FIG. 23C, the amount of stepwise change in refractive index can be reduced by increasing the number of layers of a thin film. If this process is repeated an infinite number of times to form a translucent film consisting of an infinite number of layers, the reflectance can be further decreased. In this case, forming a film consisting of an infinite number of layers having different refractive indexes can be considered to be equivalent to continuously changing the complex index of refraction in one film. Instead of forming layers an infinite number of times, the optical characteristics of a thin film may be changed in the process of forming layers to continuously change the complex index of refraction. Note that a combination of intermittent and continuous changes in complex index of refraction may be employed. In the intermittent change, the complex index of refraction need not always be changed at equal intervals with respect to the number of layers.

When exposure is performed by using such a low-reflectance translucent phase shifting mask, reflection between the mask and a demagnifying lens is reduced, and noise in a mask pattern focusing operation can be reduced. As a result, the contrast of image intensities on the wafer increases to increase the resolution and the depth of focus.

Sixth Embodiment

Figure 13A:
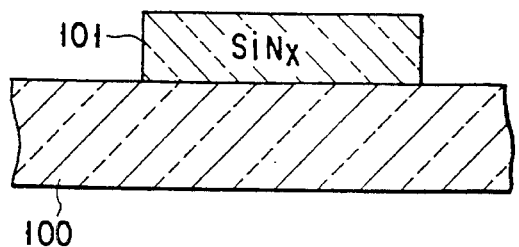
FIGS. 13A to 13C are sectional views the arrangement of a mask blank according to the sixth, eighth, and tenth embodiments, and the arrangement of a mask blank as a comparative example.
Figure 13B:
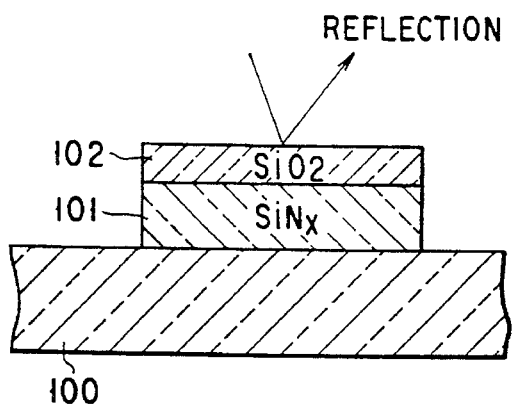
Figure 13C:
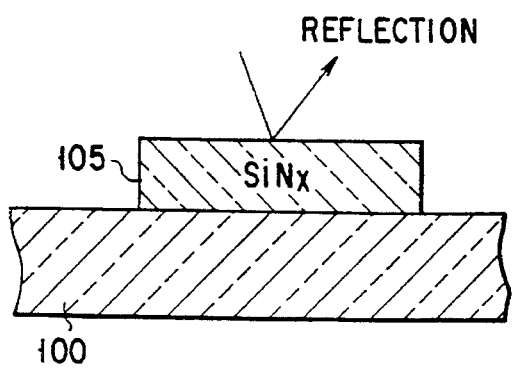

This embodiment is designed to decrease the reflectance of a transmission mask blank using an i ray emitted from a mercury lamp as exposure light. FIGS. 13A and 13B show the mask structure of the embodiment. FIG. 13C shows a single-layered mask structure as a comparative example.

In the single-layered mask shown in FIG. 13C, a silicon nitride single-layered film (translucent region) 105 is formed on an $SiO_2$ transparent substrate (transparent region) 100 by a reactive sputtering method, in which a silicon is used as a target, and the partial pressure of nitrogen as a reactive gas is controlled in an argon gas. In this case, if, for example, a single-layered film having a complex index n (=2.8–0.7i) of refraction and a thickness of about 100 nm, which is obtained by changing the composition ratio of nitrogen to Si of an $SiN_{x1}$ film, is used for the translucent region 105, the reflectivity with respect to a mercury i-ray (wavelength=365 nm) is about 27%.

This embodiment is designed such that the phase difference between light transmitted through only a transparent substrate 100 and light transmitted through both a translucent film 101 and a reflection reducing layer 102 is substantially about 180°, and the reflectivity on the film surface is 10% or less (equivalent to the reflectivity of a currently available light-shielding mask).

As shown in FIG. 13A, by slightly decreasing the composition ratio of nitrogen of the $SiN_{x1}$, a silicon nitride film (translucent film) 101 having a complex index N (=3.0–0.9i) of refraction and a thickness of 89 nm was formed. As shown in FIG. 13B, an $SiO_2$ film having thickness d=40 nm was formed, as a reflection reducing layer 102, on the silicon nitride film 101. With this process, the translucent film 101 and the reflection reducing layer 102 were formed as translucent regions. In this case, the reflectivity was decreased to about 10%. At the same time, the transmissivity and the phase difference could be set to be about 5% and 180°, respectively.

As described above, the reflectivity of the single-layered mask as the comparative example shown in FIG. 13C was about 27%. In contrast to this, the reflectivity of the mask of this embodiment shown in FIG. 13B could be decreased to about 10%.

Note that an $SiO_2$ film as the reflection reducing layer 102 may be formed by sputtering, vapor deposition, or CVD, or may be formed by oxidizing a translucent film surface. In addition, instead of nitrogen, oxygen may be used to form a translucent film. Furthermore, the quality and thickness of each film may be properly changed within the spirit and scope of the invention.

Seventh Embodiment

Figure 14A:
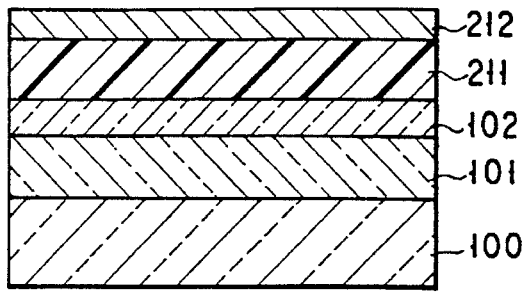
FIGS. 14A to 14D are sectional views showing the steps in manufacturing an exposure mask according to the seventh, ninth, and eleventh embodiments.
Figure 14B:
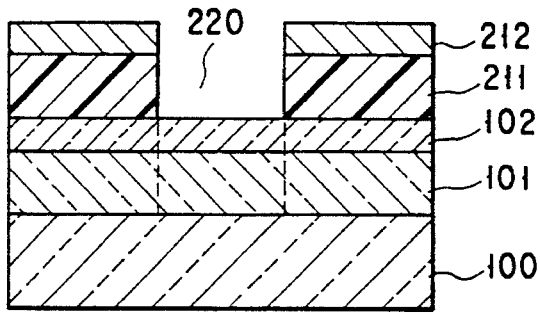

FIGS. 14A to 14D show a mask structure in accordance with the steps in manufacturing an exposure mask according to the seventh embodiment. As shown in FIG. 14A, a 0.5-μm thick electron beam resist 211 was coated on the photo mask blank (101+102) manufactured in the sixth embodiment. A 0.2-μm thick conductive film 212 was formed on the resist 211. Patterning was performed on the conductive film 212 by using an electron beam at an energy of 3 μC/cm². Thereafter, development was performed. With this process, as shown in FIG. 14B, a pattern 220 was formed on the resist 211.

Figure 14C:
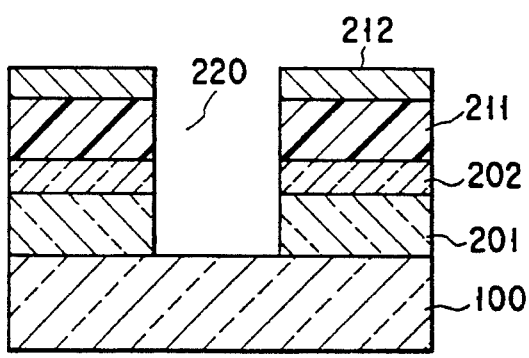

Subsequently, dry etching was performed by using the pattern 220 as a mask and a $CF_4$ gas to remove a portion, of an $SiO_2$ film 102, which is exposed from the resist pattern 220, as shown in FIG. 14C. Dry etching was then performed by using a gas mixture of $CF_4$ and $O_2$ to remove a silicon nitride film 101 at a satisfactory selectivity with respect to a transparent substrate 100. With this process, a silicon nitride film pattern (201+202) was obtained.

Figure 14D:
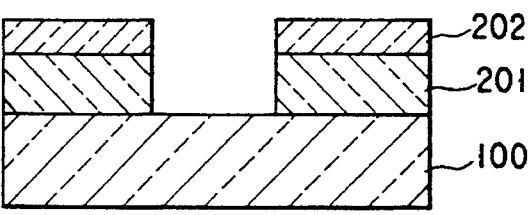

Finally, the resist pattern 220 was removed, and an exposure mask having a silicon nitride film pattern (201+202) like the one shown in FIG. 14D was completed. In this manner, a phase shifting mask with a reduced reflectance was obtained.

Exposure was performed with respect to a substrate having a 1.0-μm thick resist PFR-IX500 (available from Japan Synthetic Rubber) coated thereon, via the exposure mask formed in this manner, by using an i-ray ⅕-reducing projection exposure apparatus (NA=0.5, o=0.6). With this exposure, a resist pattern was formed. As a result, in a pattern having a line width of 0.35 μm and a line interval of 0.35 μm, the depth of focus was increased from 1.8 μm to 2.0 μm, unlike the case wherein the single-layered mask (comparative example), whose reflectance was not reduced, was used.

In this embodiment, $SiN_{x1}$ is used for a translucent film. However, a mask can be manufactured by the same method using $CrO_{xi}$, $SiO_{xi}$, $AlO_{xi}$, $TiO_{xi}$, $SnO_{xi}$, or the like. In this case, "xi" represents a composition ratio. The composition ratios xi of the above materials need not be the same. In addition, the composition ratio of nitrogen of an $SiN_x$ film as a reflection reducing film may be increased to form an $SIN_{4/3}$ film. A material such as $HfO_2$, $TaO_2$, or $SnO_2$ may be used also as a reflection reducing film.

Eighth Embodiment

This embodiment relates to a transmission exposure mask blank which can realize a reduction in reflectance when a KrF excimer laser is used as exposure light.

In general, an exposure mask used for this purpose is manufactured by forming a silicon nitride single-layered film on an $SiO_2$ transparent substrate (transparent region). The silicon nitride single-layered film is formed by a reactive sputtering method, in which silicon is used as a target, and the partial pressure of nitrogen as a reactive gas is controlled in an argon gas. In this case, if, for example, a single-layered film having a complex index N (=2.28−0.57i) of refraction and a thickness of about 100 nm, which is obtained by changing the composition ratio of nitrogen to Si of an $SiN_{x2}$ film, is used for this translucent region, the reflectivity with respect to a KrF excimer laser beam (wavelength=248 nm) is about 16%.

Referring to FIG. 13A, this embodiment is designed such that the phase difference between light transmitted through only a transparent substrate 100 and light transmitted through both a translucent film 101 and a reflection reducing layer 102 is substantially set to be about 180°, and the reflectivity on the film surface is 10% or less (equivalent to the reflectivity of a currently available light-shielding mask).

First of all, by slightly decreasing the composition ratio of nitrogen of the $SiN_{x2}$, the silicon nitride film (translucent film) 101 having a complex index N (=2.3−0.6i) of refraction and a thickness of 95 nm was formed. The $SiO_2$ film (reflection reducing layer) 102 having a thickness of 15 nm was formed on the silicon nitride film 101. In this case, the reflectivity was decreased to about 10%. At the same time, the transmissivity and the phase difference could be set to be about 5% and 180°, respectively.

Note that an $SiO_2$ film as the reflection reducing layer 102 may be formed by sputtering, vapor deposition, or CVD, or may be formed by oxidizing a translucent film surface. In addition, instead of nitrogen, oxygen may be used to form a translucent film. Furthermore, the quality and thickness of each film may be properly changed within the spirit and scope of the invention.

Ninth Embodiment

As shown in FIG. 14A, a 0.5-μm thick electron beam resist 211 was coated on the photomask blank (101+102) manufactured in the eighth embodiment. A 0.2-μm thick conductive film 212 was formed on the resist 211. Patterning was performed on the conductive film 212 by using an electron beam at an energy of 3 μC/cm². Thereafter, development was performed. With this process, a resist pattern 220 was formed.

Subsequently, dry etching was performed by using the pattern 220 as a mask and a $CF_4$ gas to remove a portion, of an $SiO_2$ film 102, which was exposed from the resist pattern 220. Dry etching was then performed by using a gas mixture of $CF_4$ and $O_2$ to remove a silicon nitride film 201 at a satisfactory selectivity with respect to a transparent substrate 100.

Finally, the resist pattern was removed, and a silicon nitride pattern covered with a reflection reducing layer was obtained. In this manner, a phase shifting mask with a reduced reflectance was obtained.

Exposure was performed with respect to a substrate having a resist SNR (available from Shipley) coated thereon, via the exposure mask formed in this manner, by using a KrF excimer ⅕-reducing projection exposure apparatus (NA= 0.45, o=0.5). With this exposure, a resist pattern was formed. As a result, in a pattern having a line width of 0.30 μm and a line interval of 0.30 μm, the depth of focus was increased from 0.7 μm to 0.9 μm, unlike the case wherein the single-layered mask (comparative example), whose reflectance was not reduced, was used.

In this embodiment, $SiN_{x2}$ is used for a translucent film. However, a mask can be manufactured by the same method using $CrO_{xi}$, $SiO_{xi}$, $AlO_{xi}$, $TiO_{xi}$, $SnO_{xi}$, or the like. In addition, as a reflection reducing film the composition ratio of nitrogen of an $SiN_x$ film may be increased to form an $SIN_{4/3}$ film. Furthermore $HfO_2$ or $TaO_2$ film may be used.

Tenth Embodiment

This embodiment exemplifies a transmission exposure mask blank which can realize a reduction in reflectance when a g-ray emitted from a mercury lamp is used as exposure light.

In general, an exposure mask used for this purpose is manufactured by forming a silicon nitride single-layered film on an $SiO_2$ transparent substrate (transparent region). The silicon nitride single-layered film is formed by a reactive sputtering method, in which silicon is used as a target, and the partial pressure of nitrogen as a reactive gas is controlled in an argon gas. In this case, if, for example, a single-layered film having a complex index N (=4.7−1.5i) of refraction and a thickness of about 59 nm is used for this translucent region, the reflectivity with respect to a g-ray emitted from the mercury lamp (wavelength=436 nm) is about 45%.

Referring to FIG. 13A, this embodiment is designed such that the phase difference between light transmitted through only a transparent substrate 100 and light transmitted through the transparent substrate 100, a translucent film 101, and a reflection reducing layer 102 is substantially set to be about 180°, and the reflectivity on the film surface is 10% or less.

First of all, by, for example, introducing a small amount of nitrogen in the formation of an Si film, a silicon nitride film having a complex index N (=4.4−1.4i) of refraction and a thickness of 60 nm was formed. An $SiO_2$ film having a thickness of 65 nm was formed on the silicon nitride film as a translucent region. In this case, the reflectivity was decreased to about 15%. At the same time, the transmissivity and the phase difference could be set to be about 5% and 180°, respectively.

Note that this $SiO_2$ film may be formed by sputtering, vapor deposition, or CVD, or may be formed by oxidizing a translucent film surface. In addition, instead of nitrogen, oxygen may be used to form a translucent film. Furthermore, the quality and thickness of each film may be properly changed within the spirit and scope of the invention.

Eleventh Embodiment

As shown in FIGS. 14A to 14D, a 0.5-μm thick electron beam resist 211 was coated on the photomask blank manufactured in the eighth embodiment. A 0.2-μm thick conductive film 212 was formed on the resist 211. Patterning was performed on the conductive film 212 by using an electron beam at an energy of 3 μC/cm². Thereafter, development was performed. With this process, a resist pattern 220 was formed.

Subsequently, dry etching was performed by using the pattern 220 as a mask and a $CF_4$ gas to remove a portion, of an $SiO_2$ film, which was exposed from the resist pattern. Etching was then performed by using a gas mixture of $CF_4$ and $O_2$ to remove a silicon nitride film 101 at a satisfactory selectivity with respect to a transparent substrate 100.

Finally, the resist pattern was removed, and a silicon nitride pattern covered with a reflection reducing layer was obtained. In this manner, a phase shifting mask with a reduced reflectance was obtained.

Exposure was performed with respect to a substrate having a 1.5-μm thick resist PFR7750 (available from Japan Synthetic Rubber) coated thereon, via the exposure mask formed in this manner, by using a g-ray ⅕-reducing projection exposure apparatus (NA=0.54, o=0.5). with this exposure, a resist pattern was formed. As a result, in a pattern having a line width of 0.45 μm and a line interval of 0.45 μm, the focus margin was increased in the depth of focus from 0.7 μm to 1.1 μm, unlike the case wherein the single-layered mask (comparative example), whose reflectance was not reduced, was used.

In this embodiment, $SiN_{x2}$ is used for a translucent film. However, a mask can be manufactured by the same method using $CrO_{xi}$, $SiO_{xi}$, $AlO_{xi}$, $TiO_{xi}$, $SnO_{xi}$, or the like. In addition, as a reflection reducing film the composition ratio of nitrogen of an $SiN_x$ film may be increased to form an $SIN_{4/3}$ film. Furthermore $HfO_2$, $TaO_2$ or $SnO_2$ film may be used.

Twelfth Embodiment

Figure 15A:
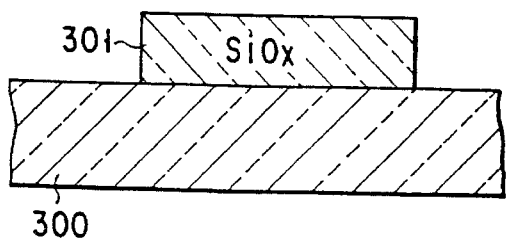
FIGS. 15A to 15C are sectional views the arrangement of a mask blank according to the twelfth embodiment, and the arrangement of a mask blank as a comparative example.
Figure 15B:
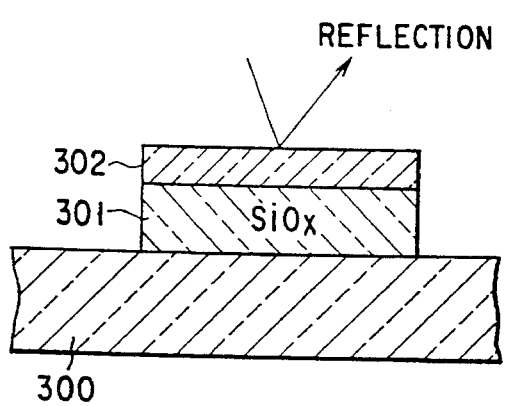
Figure 15C:
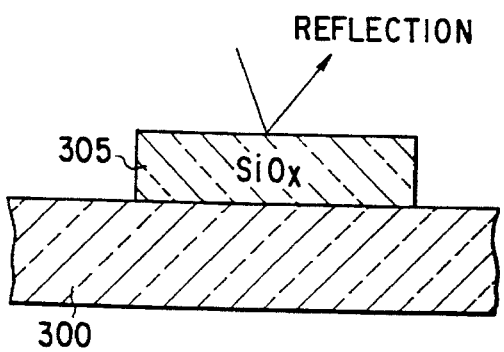

This embodiment exemplifies a transmission exposure mask blank which can realize a reduction in reflectance when an ArF excimer laser is used as exposure light. FIGS. 15A and 15B show the mask structure of this embodiment. FIG. 15C shows a mask structure as a comparative example.

In the mask as the comparative example shown in FIG. 15C, a silicon oxide single-layered film 305 is generally formed on an $SiO_2$ transparent substrate (transparent region) 300 by a reactive sputtering method, in which silicon is used as a target, and the partial pressure of oxygen as a reactive gas is controlled in an argon gas. In this case, if, for example, a single-layered film having refractive index n=1.58 and a thickness of about 166 nm, which is obtained by changing the composition ratio of oxygen to Si of an $SiO_{x3}$ film, is used for this translucent region 305, the reflectivity with respect to an ArF excimer laser beam (wavelength=193 nm) is about 6%.

As shown in FIG. 15B, this embodiment is designed such that the phase difference between light transmitted through only the transparent substrate 300 and light transmitted through the transparent substrate 300, a translucent film 301, and a reflection reducing layer 302 is substantially set to be about 180°, and the reflectivity on the film surface is 10% or less (equivalent to the reflectivity of a currently available light-shielding mask).

Although the single-layered mask as the comparative example had a sufficiently low reflectance, the reflectance of the mask could be further reduced in the following manner. First of all, by slightly increasing the composition ratio of oxygen of the $SiO_{x3}$, the silicon oxygen film (translucent film) 301 having refractive index n=1.61 and a thickness of 150 nm was formed, as shown in FIG. 15A. Subsequently, as shown in FIG. 15B, the $SiO_2$ film (reflection reducing layer) 302 having a thickness of 10 nm was formed, as a translucent region, on the silicon nitride film 301. In this case, the reflectivity was decreased to about 3%. At the same time, the transmissivity and the phase difference could be set to be about 3.5% and 180°, respectively.

The reflectivity of the single-layered mask as the comparative example shown in FIG. 15C was about 6%. In contrast to this, the reflectivity of the mask of the embodiment shown in FIG. 15B could be decreased to about 3%.

Note that an $SiO_2$ film as a reflection reducing layer 102 may be formed by sputtering, vapor deposition, or CVD or may be formed by oxidizing a translucent film surface. In addition, instead of nitrogen, oxygen may be used to form a translucent film. Furthermore, the quality and thickness of each film may be properly changed within the spirit and scope of the invention.

Thirteenth Embodiment

Figure 16A:
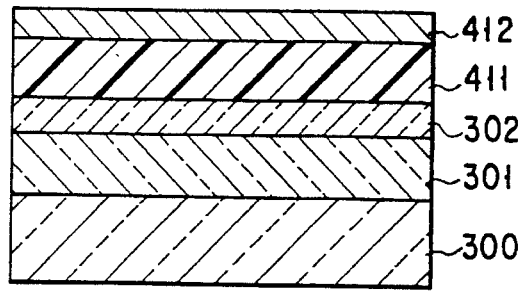
FIGS. 16A to 16D are sectional views showing the steps in manufacturing an exposure mask according to the thirteenth embodiment.
Figure 16B:
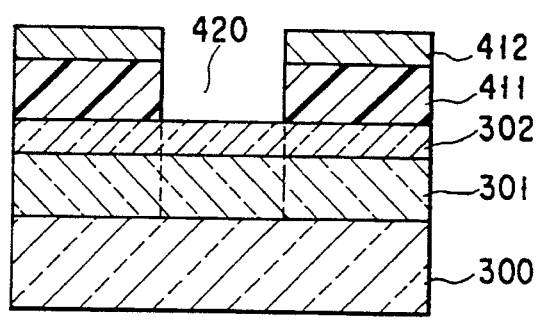

FIGS. 16A to 16D are sectional views showing the steps in manufacturing an exposure mask according to the thirteenth embodiment. As shown in FIG. 16A, a 0.5-μm thick electron beam resist 411 was coated on the photomask blank (301+302) manufactured in the twelfth embodiment. A 0.2-μm thick conductive film 412 was formed on the resist 411. Patterning was performed on the conductive film 412 by using an electron beam at an energy of 3 μC/cm². Thereafter, development was performed. With this process, as shown in FIG. 16B, a resist pattern 420 was formed.

Figure 16C:
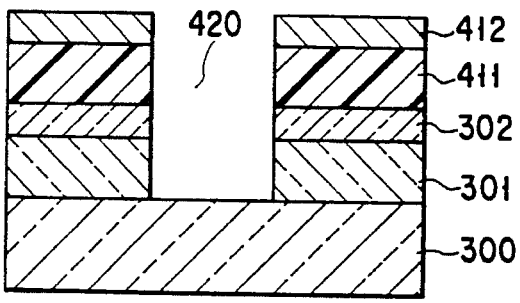

Subsequently, as shown in FIG. 16C, dry etching was performed by using the pattern 420 as a mask and a $CF_4$ gas to remove a portion, of an $SiO_2$ film 302, which was exposed from the resist pattern 420. Etching was then performed by using a gas mixture of $CF_4$ and $O_2$ to remove a silicon nitride film 301 at a satisfactory selectivity with respect to a transparent substrate 400.

Figure 16D:
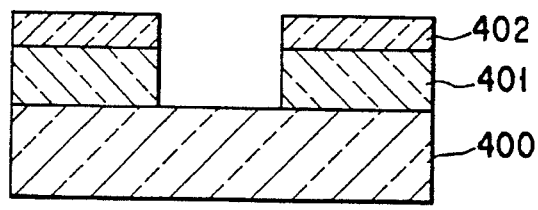

Finally, the resist pattern 420 was removed, and an exposure mask having a silicon oxide film pattern (401+402) like the one shown in FIG. 16D was completed. In this manner, a phase shifting mask with a reduced reflectance was obtained.

Exposure was performed with respect to a substrate having a resist coated thereon, via the exposure mask formed in this manner, by using an ArF excimer ⅕-reducing projection exposure apparatus (NA=0.54, o=0.5). with this exposure, a resist pattern was formed. As a result, in a pattern having a line width of 0.20 μm and a line interval of 0.20 μm, the focus margin was increased from 0.4 μm to 0.6 μm, unlike the case wherein the single-layered mask as the comparative example, whose reflectance was not reduced, was used.

In this embodiment, $SiO_{x3}$ is used for a translucent film. However, a mask can be manufactured by the same method using $CrO_{xi}$, $AlO_{xi}$, $TiO_{xi}$, $SnO_{xi}$, or the like.

Fourteenth Embodiment

Figure 17A:
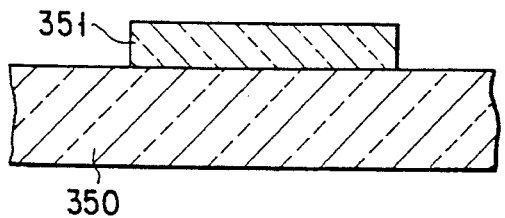
FIGS. 17A to 17C are sectional views the arrangement of a mask blank according to the fourteenth embodiment, and the arrangement of a mask blank as a comparative example.
Figure 17B:
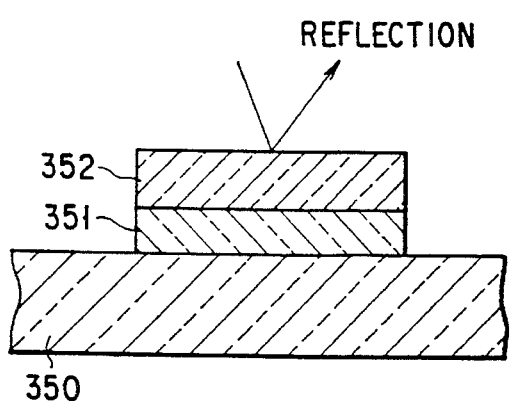
Figure 17C:
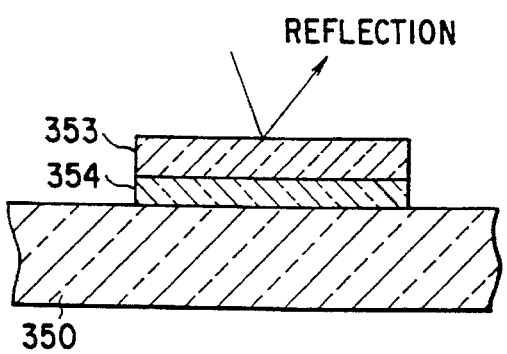

This embodiment exemplifies a transmission exposure mask blank which can realize a reduction in reflectance when an i-ray emitted from a mercury lamp is used as exposure light. FIGS. 17A and 17B show the mask structure of this embodiment. FIG. 17C shows a mask structure as a comparative example.

FIG. 17C shows a phase shifting mask obtained by forming a phase shifting layer on an $SiO_2$ transparent substrate (transparent region) 350. This phase shifting layer has a two-layered structure constituted by an SOG (Spin On Glass) film 354 having a refractive index of 1.43 and a chromium oxide film 353 having a complex index of refraction of about 1.98–2.6i and a thickness of about 21 nm. The reflectivity of this phase shifting mask with respect to an i-ray emitted from the mercury lamp (wavelength=365 nm) is about 40%.

As shown in FIG. 17B, this embodiment is designed such that the phase difference between light transmitted through only the transparent substrate 350 and light transmitted through the transparent substrate 350, a translucent region 351, and a reflection reducing layer 352 is substantially set to be about 180°, and the reflectivity on the film surface is 10% or less (equivalent to the reflectivity of a currently available light-shielding mask).

First of all, the chromium oxide film 351 having a complex index N (=2.2–1.1i) of refraction and a thickness of 80 nm was formed by using a reactive sputtering method and adjusting the composition ratio of oxygen of a chromium oxide. The $SiO_2$ film (reflection reducing layer) 352 having a thickness of 188 nm was formed on the chromium oxide film 351 by a sputtering method, thereby forming a translucent region having a two-layered structure constituted by the films 351 and 352. In this case, the reflectivity was reduced to about 7%. At the same time, the transmissivity and the phase difference could be set to be about 5% and 180°, respectively.

The reflectivity of the phase shifting mask as the comparative example shown in FIG. 17C, which had the two-layered structure, was about 40%. In contrast to this, the reflectivity of the mask of the embodiment shown in FIG. 17B could be decreased to about 7%.

Note that the $SiO_2$ film 352 as a reflection reducing layer may be formed by sputtering, vapor deposition, or CVD. Furthermore, the quality and thickness of each film may be properly changed within the spirit and scope of the invention.

Fifteenth Embodiment

Figure 18A:
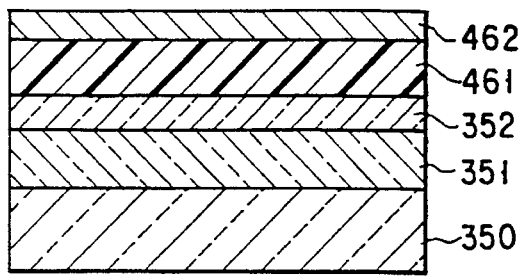
FIGS. 18A to 18D are sectional views showing the steps in manufacturing an exposure mask according to the fifteenth embodiment.
Figure 18B:
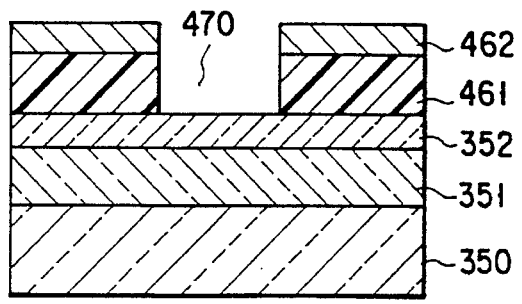

FIGS. 18A to 18D are sectional views showing the steps in manufacturing an exposure mask according to the fifteenth embodiment. As shown in FIG. 18A, a 0.5-μm thick electron beam resist 461 was coated on the photomask blank (351+352) manufactured in the fourteenth embodiment. A 0.2-μm thick conductive film 462 was formed on the resist 461. Patterning was performed on the conductive film 462 by using an electron beam at an energy of 3 μC/cm². Thereafter, development was performed. With this process, as shown in FIG. 18B, a resist pattern 470 was formed.

Figure 18C:
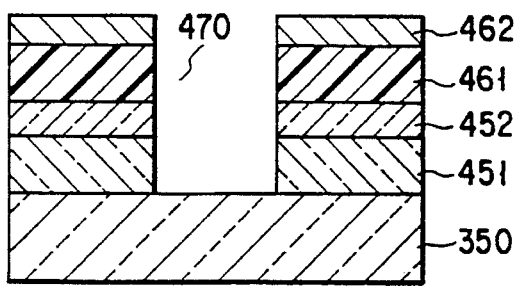

Subsequently, as shown in FIG. 18C, dry etching was performed by using the resist pattern 470 as a mask and a $CF_4$ gas to remove a portion, of an $SiO_2$ film 352, which was exposed from the resist pattern 470. Dry etching was then performed by using a gas mixture of oxygen and chlorine to remove a chromium oxide film 351 at a satisfactory selectivity with respect to a transparent substrate 350.

Figure 18D:
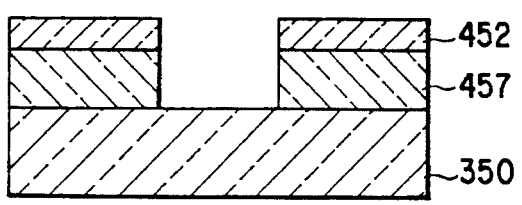

Finally, the resist pattern 470 was removed, and an exposure mask having a translucent region pattern (451+452) with a two-layered structure like the one shown in FIG. 18D was completed. In this manner, a phase shifting mask with a reduced reflectance was obtained.

Exposure was performed with respect to a substrate having a 1.0-μm thick resist PFR-IX500 (available from Japan Synthetic Rubber) coated thereon, via the exposure mask formed in this manner, by using an i-ray ⅕-reducing projection exposure apparatus (NA=0.5, o=0.6). with this exposure, a resist pattern was formed. As a result, in a pattern having a line width of 0.35 μm and a line interval of 0.35 μm, the depth of focus was increased from 1.7 μm to 2.1 μm, unlike the case wherein the two-layered mask as the comparative example, whose reflectance was not reduced, was used.

In this embodiment, a two-layered structure constituted by an $SiO_2$ film and a chromium oxide film is used for a translucent region. However, a mask can be manufactured by the same method by using $SIN_{4/3}$ in place of $SiO_2$, and $SiN_{xi}$, $CrO_{xi}N_{yi}$, $SiO_{xi}$, $AlO_{xi}$, $MoSiO_{xi}$, $MoSiO_{xi}N_{yi}$, $TiO_{xi}$, $SnO_{xi}$, or the like in place of chromium oxide.

Sixteenth Embodiment

Figure 19A:
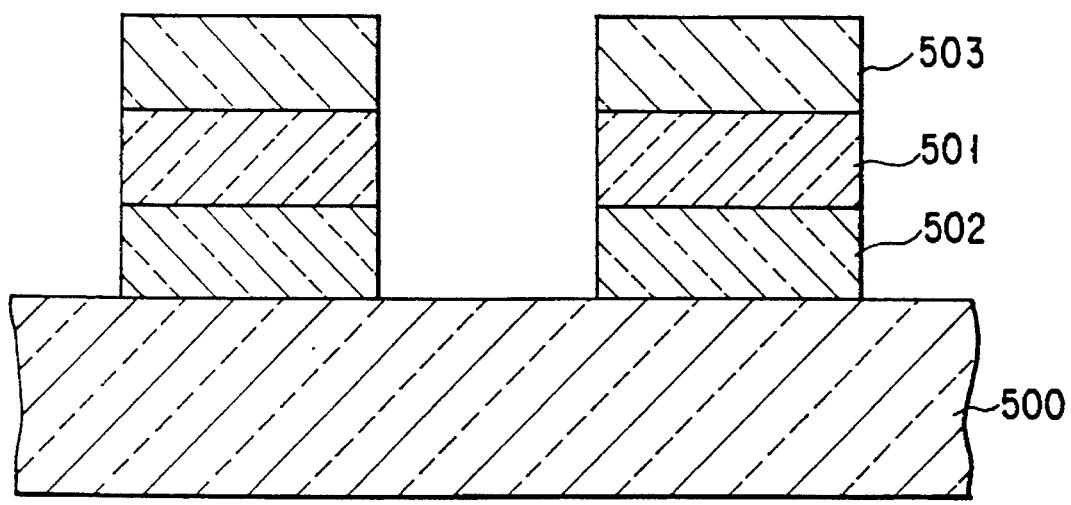
FIGS. 19A and 19B are views respectively showing the arrangement of an exposure mask according to the sixteenth and seventeenth embodiments, and a refractive index distribution.
Figure 19B:
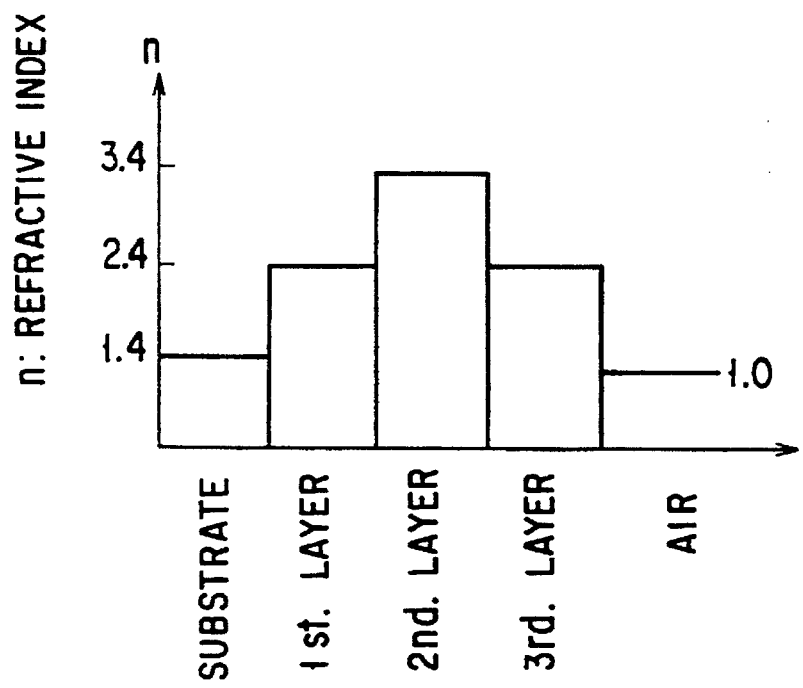

The sixteenth embodiment of the present invention will be described next with reference to FIGS. 19A and 19B.

A translucent layer is formed on a transparent substrate 500 consisting of $SiO_2$ or the like. This translucent layer has a three-layered structure constituted by three films 501, 502, and 503 having different optical constants. More specifically, the film 501 is a translucent film having a refractive index n and an extinction coefficient k which are optimized to allow a mask of this embodiment to exhibit a satisfactory effect. The films 502 and 503 are used to reduce the reflectance of the translucent film. The refractive indexes and extinction coefficients of these films are set to reduce the reflectance. In addition, this three-layered structure is designed such that the phase difference between light transmitted through all the three films 501, 502, and 503 and light passing through an opening portion adjacent thereto is 180° in consideration of multiple reflection, and the amplitude transmissivity is 22%.

The mask structure shown in FIG. 19A will be described next with reference to materials to be used in practice. Note that i-ray (λ=365 nm) was used in this embodiment as exposure light. As is apparent, the basic concept of the present invention does not change with a change in the wavelength of exposure light to be used, even though the film of the halftone mask of the present invention itself changes. A quartz substrate was used as the transparent substrate 500. An $SiN_{x4}$ film (n=3.4, k=1.2) was used as the translucent film 501.

In a halftone mask formed by using only the translucent film 501, the differences between the refractive indexes and extinction coefficients of the $SiN_{x4}$ film, the substrate, and the exposure atmosphere (air) are large, and the reflectivity on a surface having no translucent film formed thereon and the $SiN_{x4}$ film surface are as high as 16% and 27%, respectively. In this embodiment, therefore, in order to reduce the reflectances on the $SiN_{x4}$ film surface and the surface having no translucent film formed thereon, $SiN_y$ films, each having a refractive index and an extinction coefficient intermediate between the refractive indexes and extinction coefficients of the SiO$_2$ film and the SiN film or between those of the SiN film and the exposure atmosphere, were formed, as the films 502 and 503, on the boundary surfaces between the SiO$_2$ film, the SiN film, and the exposure atmosphere. In this structure, the reflectances of the respective layers in the embodiment were set as shown in FIG. 19B.

FIGS. 20A to 20C show a method of forming a translucent film constituted by three layers when an i-ray ($\lambda$=365 nm) is to be used. As a film forming apparatus, a sputtering apparatus was used. In this apparatus, an Si target 601 and a substrate holder 602 were arranged in a reaction vessel 600. Ar and N$_2$ gases were introduced into the vessel 600 via a gas inlet port at controlled flow rates. The transparent substrate 500 was placed on the substrate holder 602.

An N$_2$ gas was mixed into an argon gas atmosphere, and Si was sputtered with the controlled flow rate of the N$_2$ gas, thereby forming an SiN$_y$ film 502 on the transparent substrate 500, as shown in FIG. 20A. In this case, the optical constants of the SiN$_y$ film 502 were: refractive index n=2.4, and extinction coefficient k=0.6; and the thickness of the film was 0.035 µm.

Subsequently, the flow rate of N$_2$ in the argon gas was controlled to set refractive index n=3.4 to form the 0.033-µm thick SiN$_{x4}$ film 501 on the SiN$_y$ film 502. In this case, extinction coefficient k=1.2.

The flow rate of N$_2$ in the argon gas was controlled to set refractive index n=2.4 and extinction coefficient k=0.6 to form the 0.038-µm thick SiN$_y$ film 503 on the SiN$_{x4}$ film 501. By changing the refractive indexes and extinction coefficients of the films stepwise in this manner, the reflectance on the surface of the translucent films was reduced and suppressed.

When the SiN$_y$ film 502 with n=2.4 and k=0.6 was formed between the SiN$_{x4}$ film 501 and the SiO$_2$ substrate 500, and the SiN$_y$ film 503 having the same optical constants as those of the film 502 was formed on the SiN$_{x4}$ film 501, as in this embodiment, the reflectance of the translucent region was greatly reduced from 27% to 3.6%.

A pattern having a line width of 0.35 µm and a line interval of 0.35 µm was transferred onto a substrate having a 1.0-µm thick i-ray positive resist coated thereon by using the translucent phase shifting mask of this embodiment and an i-ray exposure apparatus ($\lambda$=365 nm, NA=0.6, o=0.5). In this pattern, a depth of focus was obtained to be 2.20 µm. Note that when no reflection reducing process was performed, the depth of focus was only 1.8 µm.

Seventeenth Embodiment

A mask structure as the seventeenth embodiment of the present invention will be described next with reference to FIG. 19A. Translucent films 502, 501, and 503 are formed on a transparent substrate 500. Similar to the fifteenth embodiment, this translucent film has a three-layered structure constituted by three films having different optical constants.

In a halftone mask having a translucent film consisting of only an Si film (n=4.6, k=1.4), the differences between the refractive indexes and extinction coefficients of the Si film, the substrate, and the exposure atmosphere (air) are large, and the reflectivity on a surface having no translucent film formed thereon and the Si film surface are as high as 31% and 46%, respectively. In this embodiment, therefore, in order to reduce the reflectances on the Si film surface and the surface having no translucent film formed thereon, SiN films, each having a refractive index and an extinction coefficient intermediate between the refractive indexes and extinction coefficients of the SiO$_2$ and SiO films or between those of the Si film and the exposure atmosphere, were respectively formed on the boundary surfaces between the SiO$_2$ film, the Si film, and the exposure atmosphere.

A method of forming a three-layered translucent film when a g-ray ($\lambda$=436 nm) is to be used will be described with reference to FIGS. 20A to 20C. An N$_2$ gas was introduced, at a controlled flow rate, into an argon gas whose flow rate was controlled, thus forming the 0.014-µm thick SiN$_{x5}$ film 502 on the transparent substrate 500. In this case, refractive index n=3.0 and extinction coefficient k=0.7. Si was then sputtered to form the Si film 501. In this case, the optical constants of the Si film 501 were: refractive index n=4.6 and extinction coefficient k=1.4; and the thickness of the film was 0.053 µm. N$_2$ in the argon gas was controlled to set refractive index n=3.0 and extinction coefficient k=0.7 so as to form the 0.009-µm thick SiN$_{x5}$ film 501. In this manner, the refractive indices of the films can be controlled stepwise.

When the Si films (502, 503) with n=4.6 and k=1.4 were formed between the Si film 501 and the SiO$_2$ substrate 500, and on the Si film 501, as in this embodiment, the reflectivity of the translucent region was greatly reduced from 46% to 17%.

A pattern having a line width of 0.50 µm and a line interval of 0.50 µm was transferred onto a substrate having a 1.0-µm thick g-ray positive resist coated thereon by using the translucent phase shifting mask of this embodiment and a g-ray exposure apparatus ($\lambda$=436 nm, NA=0.54, o=0.5). In this pattern, a depth of focus was obtained to be 1.8 µm. Note that when no reflection reducing process was performed, the depth of focus was only 1.4 µm.

The present invention is not limited to the above embodiments. Films constituting a translucent region may have desired transmissivities as a whole, and may be partly transparent. In addition, the material and thickness of each film of the translucent region may be properly changed depending on conditions such as a desired transmissivity and a required phase difference (180°). various changes and modifications can be made within the spirit and scope of the invention.

Eighteenth Embodiment

This embodiment relates to a transmission mask blank which can realize a reduction in reflectance when an i-ray emitted from a mercury lamp is used as exposure light.

In a general mask, a chromium oxynitride single-layered film (translucent region) is formed on an SiO$_2$ transparent substrate (transparent region) by a reactive sputtering method, in which chromium is used as a target, and the partial pressures of oxygen and nitrogen as reactive gases are respectively controlled in an argon gas. In this case, if, for example, a single-layered film having a complex index N (=2.8–0.55i) of refraction and a thickness of about 105 nm, which is obtained by changing the composition ratios of oxygen and nitrogen to Cr of a CrO$_{x5}$N$_{y5}$ film, is used for this translucent region, the reflectivity with respect to an i-ray emitted from the mercury lamp (wavelength=365 nm) is about 27%.

This embodiment is designed such that the phase difference between light transmitted through only a transparent substrate and light transmitted through both a translucent film and a reflection reducing layer is substantially set to be about 180°, and the reflectivity on the film surface is 27% or less.

First of all, by adjusting the composition ratios of oxygen and nitrogen of the $CrO_{x5}N_{y5}$ film, a chromium oxynitride film $CrO_{x6}N_{y6}$ (translucent film) having a complex index N (=2.8–0.55i) of refraction and a thickness of 62 nm was formed. Subsequently, a chromium oxynitride film $CrO_{x7}N_{y7}$ having a complex index N (=2.5–0.50i) of refraction and a thickness of 50.4 nm was formed on the resultant structure by adjusting the composition ratios of oxygen and nitrogen. With this process, a translucent region was formed. In this case, the reflectivity was decreased to about 21%. At the same time, the transmissivity and the phase difference could be set to be about 10% and 180°, respectively.

Note that the reflectivity on the film surface can be set to be 27% or less with the use of a combination other than (x6, x7, y6, y7).

In addition, the quality and thickness of each film may be properly changed within the spirit and scope of the invention.

This embodiment relates to a mask blank to be used together with an i-ray as exposure light. However, a mask blank to be used together with a KrF laser beam as exposure light can also be manufactured by the same method except that the composition ratios of oxygen and nitrogen are changed.

Nineteenth Embodiment

A 0.5-μm thick electron beam resist was coated on the photomask blank manufactured in the eighteenth embodiment. A 0.2-μm thick conductive film was formed on the resist. Patterning was performed on the conductive film by using an electron beam at an energy of 3 μC/cm². Thereafter, development was performed. With this process, a resist pattern was formed.

Subsequently, etching was performed by using the resist pattern as a mask while adjusting the mixture ratio of chlorine and oxygen to remove portions, of chromium oxynitride films $CrO_{x7}N_{y7}$ and $CrO_{x6}N_{y6}$, which were exposed from the resist pattern, at satisfactory selectivities with respect to the substrate. With this process, a chromium oxynitride pattern was obtained.

Finally, the resist pattern was removed, and a chromium oxynitride pattern was obtained. In this manner, a phase shifting mask with a reduced reflectance was obtained.

Exposure was performed with respect to a substrate having a 1.0-μm thick resist PFR-IX500 (available from Japan Synthetic Rubber) coated thereon, via the exposure mask formed in this manner, by using an i-ray ⅕-reducing projection exposure apparatus (NA=0.5, o=0.6). With this exposure, a resist pattern was formed. As a result, in a pattern having a line width of 0.35 μm and a line interval of 0.35 μm, the depth of focus was increased from 1.8 μm to 1.9 μm, unlike the case wherein a mask whose reflectance was not reduced was used.

Exposure was performed with respect to a substrate having a 1.0-μm thick resist PFR-IX500 (available from Japan Synthetic Rubber) coated thereon, via the above exposure mask, by using an i-ray ⅕-reducing projection exposure apparatus (NA=0.5, o=0.6) in combination with an annular illumination method. With this exposure, a resist pattern was formed. As a result, in a pattern having a line width of 0.35 μm and a line interval of 0.35 μm, the depth of focus was increased from 1.8 μm to 2.3 μm, unlike the case wherein a mask whose reflectance was not reduced was used.

Exposure was performed with respect to a substrate having a 1.0-μm thick resist PFR-IX500 (available from Japan Synthetic Rubber) coated thereon, via the above exposure mask, by using an i-ray ⅕-reducing projection exposure apparatus (NA=0.5, o=0.6) in combination with an illumination method using a diaphragm having aperture portions at four positions symmetrical about an optical axis. With this exposure, a resist pattern was formed. As a result, in a pattern having a line width of 0.35 μm and a line interval of 0.35 μm, the depth of focus was increased from 1.8 μm to 2.5 μm, unlike the case wherein a mask whose reflectance was not reduced was used.

Exposure was performed with respect to a substrate having a 1.0-μm thick resist PFR-IX500 (available from Japan Synthetic Rubber) coated thereon, via the above exposure mask, by using an i-ray ⅕-reducing projection exposure apparatus (NA=0.5, o=0.3). With this exposure, a resist pattern was formed. As a result, in an isolated hole pattern having a hole diameter of 0.45 μm (hole diameter/distance between adjacent holes=⅕), the depth of focus was increased from 1.2 μm to 1.9 μm, unlike the case wherein a mask whose reflectance was not reduced was used.

In this embodiment, chromium oxynitrides are used. However, a combination of Cr and $CrO_{xi}$, Cr and $CrO_{xi}N_{yi}$, $CrO_{xi}$ and $CrO_{yi}$, $CrO_{xi}$ and $CrO_{yj}N_{yi}$, $CrN_{xi}$ and $CrN_{yi}$, $CrN_{xi}$ and $CrO_{yi}$, or $CrN_{xi}$ and $CrO_{xi}N_{yi}$ may be used. Hydrogen may be added in a selected combination, as needed.

Twentieth Embodiment

This embodiment relates to a transmission mask blank which can realize a reduction in reflectance when an i-ray emitted from a mercury lamp is used as exposure light.

In a general mask, an $MoSiO_{x8}$ film (translucent region) is formed on an $SiO_2$ transparent substrate (transparent region) by a reactive sputtering method, in which MoSi is used as a target, and the partial pressure of oxygen as a reactive gas is controlled in an argon gas. In this case, if, for example, a single-layered film having a complex index N (=2.0–0.455i) of refraction and a thickness of about 185.6 nm, which is obtained by changing the composition ratio of oxygen to MoS of the $MoSiO_{x8}$ film, is used for this translucent region, the reflectivity with respect to an i-ray emitted from the mercury lamp (wavelength=365 nm) is about 12.5%.

This embodiment is designed such that the phase difference between light transmitted through only a transparent substrate and light transmitted through both a translucent film and a reflection reducing layer is substantially set to be about 180°, and the reflectivity on the film surface is 12.5% or less.

First of all, by adjusting the composition ratio of oxygen of the $MoSiO_{x8}$ film, an $MoSiO_{x9}$ film (translucent film) having a complex index N (=2.0–0.45i) of refraction and a thickness of 103.9 nm was formed. Subsequently, an $MoSiO_{x10}$ having a complex index N (=1.85–0.395i) of refraction and a thickness of 95.8 nm was formed on the resultant structure by adjusting the composition ratio of oxygen. With this process, a translucent region was formed. In this case, the reflectivity was decreased to about 10.8%. At the same time, the transmissivity and the phase difference could be set to be about 5% and 180°, respectively.

Note that the reflectivity on the film surface can be set to be 12.5% or less with the use of a combination other than (x9, x10).

In addition, the quality and thickness of each film may be properly changed within the spirit and scope of the invention.

This embodiment relates to a mask blank to be used together with an i-ray as exposure light. However, a mask blank to be used together with a KrF laser beam as exposure light can also be manufactured by the same method except that the composition ratio of oxygen is changed.

Twenty-First Embodiment

A 0.5-μm thick electron beam resist was coated on the photomask blank manufactured in the twentieth embodiment. A 0.2-μm thick conductive film was formed on the resist. Patterning was performed on the conductive film by using an electron beam at an energy of 3 μC/cm$^2$. Thereafter, development was performed. With this process, a resist pattern was formed.

Subsequently, etching was performed by using the resist pattern as a mask while adjusting the mixture ratio of $CF_4$ and oxygen to remove portions, of the $MoSiO_{x9}$ and $MoSiO_{x10}$ films, which were exposed from the resist pattern, at satisfactory selectivities with respect to the substrate. With this process, a molybdenum oxysilicide pattern was obtained.

Finally, the resist pattern was removed, and a molybdenum oxysilicide pattern was obtained. In this manner, a phase shifting mask with a reduced reflectance was obtained.

Exposure was performed with respect to a substrate having a 1.0-μm thick resist PFR-IX500 (available from Japan Synthetic Rubber) coated thereon, via the exposure mask formed in this manner, by using an i-ray ⅕-reducing projection exposure apparatus (NA=0.5, o=0.6). with this exposure, a resist pattern was formed. As a result, in a pattern having a line width of 0.35 μm and a line interval of 0.35 μm, the depth of focus was increased from 1.9 μm to 2.0 μm, unlike the case wherein a mask whose reflectance was not reduced was used.

Exposure was performed with respect to a substrate having a 1.0-μm thick resist PFR-IX500 (available from Japan Synthetic Rubber) coated thereon, via the above exposure mask, by using an i-ray ⅕-reducing projection exposure apparatus (NA=0.5, o=0.6) in combination with an annular illumination method. With this exposure, a resist pattern was formed. As a result, in a pattern having a line width of 0.35 μm and a line interval of 0.35 μm, the depth of focus was increased from 1.9 μm to 2.4 μm, unlike the case wherein a mask whose reflectance was not reduced was used.

Exposure was performed with respect to a substrate having a 1.0-μm thick resist PFR-IX500 (available from Japan Synthetic Rubber) coated thereon, via the above exposure mask, by using an i-ray ⅕-reducing projection exposure apparatus (NA=0.5, o=0.6) in combination with an illumination method using a diaphragm having aperture portions at four positions symmetrical about an optical axis. With this exposure, a resist pattern was formed. As a result, in a pattern having a line width of 0.35 μm and a line interval of 0.35 μm, the depth of focus was increased from 1.9 μm to 2.6 μm, unlike the case wherein a mask whose reflectance was not reduced was used.

Exposure was performed with respect to a substrate having a 1.0-μm thick resist PFR-IX50 (available from Japan Synthetic Rubber) coated thereon, via the above exposure mask, by using an i-ray ⅕-reducing projection exposure apparatus (NA=0.5, o=0.3). With this exposure, a resist pattern was formed. As a result, in an isolated hole pattern having a hole diameter of 0.45 μm (hole diameter/distance between adjacent holes=⅕), the depth of focus was increased from 1.3 μm to 2.0 μm, unlike the case wherein a mask whose reflectance was not reduced was used.

In this embodiment, $MoSiO_{xi}$ and $MoSiO_{yi}$ are used. However, a combination of $MoSiN_{xi}$ and $MoSiO_{yi}$, $MoSiN_{xi}$ and $MoSiN_{yi}$, $MoSiN_{xi}$ and $MoSiO_{yj}N_{xj}$, $MoSiO_{xi}$ and $MoSiO_{xj}N_{yj}$, or $MoSiO_{xi}N_{yi}$ and $MoSiO_{xj}N_{yj}$ may be used. Hydrogen may be added in a selected combination, as needed.

Furthermore, a combination of oxynitrides of WSi, TiSi, TaSi, NiSi, CuSi, or AlSi may be used similar to a combination of oxynitrides of MoSi.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A reflection phase shifting mask comprising:

a substrate for reflecting exposure light;

a phase shifting layer formed on a portion on said substrate; and a light transmitting medium formed on said phase shifting layer, wherein a thickness of said phase shifting layer is set such that a phase difference between light reflected by said substrate and light reflected by said phase shifting layer becomes substantially 180°, and wherein refractive indexes of said light transmitting medium, said phase shifting layer, and said substrate are respectively represented by $n_0$, $n_1$, and $n_2$, and H and L are integers satisfying H<L, a material and thickness d of said phase shifting layer are determined such that the refractive index $n_1$ and thickness d of the phase shifting layer satisfy the following conditions:

$$\{(H+0.06\ L)/1.06\ L\}n_0 < n_1 < \{H-0.06\ L\}\ 0.94\ L\}n_0 \quad d=\{L/2n_0 \pm 0.06/4n_1\}\lambda \text{ for } n_1<n_0<n_2,$$

and satisfy the following conditions:

$$\{(H-0.06\ L)/0.94\ L\}n_0 < n_1 < \{H+0.06\ L)/1.06\ L\}n_0 \quad d=\{(2L+1)/4n_0 \pm 0.06/4n_1)\lambda \text{ for } n_2<n_0<n_1.$$

2. A mask according to claim 1, wherein said light transmitting medium is a material selected from the group consisting of $SiO_2$, $Si_3N_4$, LiF, $MgF_2$ and $TiO_2$.

3. A mask according to claim 1, further comprising a reflection reducing layer formed on said light transmitting medium.

4. A mask according to claim 3, wherein said reflection reducing layer is an antireflection film having a reflectance of not more than 1%.

5. A mask according to claim 1, wherein said phase shifting layer is formed by depositing one of a translucent thin film and a transparent thin film on a substrate, and selectively etching said thin film.

6. A mask according to claim 1, wherein the thickness and refractive index of said phase shifting layer are set such that light reflected by said phase shifting layer has substantially the same phase as that of light which is transmitted through said phase shifting layer, reflected by said substrate, and output from said phase shifting layer.

7. A mask according to claim 1, wherein the thickness and refractive index of said phase shifting layer are set such that a phase difference between light reflected by said phase shifting layer and light which is transmitted through said phase shifting layer, reflected by said substrate, and output from said phase shifting layer becomes substantially 180°.

8. A method of forming a pattern, comprising the steps of:

preparing a reflection phase shifting mask having a substrate for reflecting exposure light, a phase shifting layer formed on a portion on said substrate, and a light transmitting medium formed on said substrate and said phase shifting layer, wherein a thickness of said phase shifting layer is set such that a phase difference between light reflected by said substrate and light reflected by said phase shifting layer becomes substantially 180°;

radiating exposure light having a shorter wavelength than an ultraviolet ray on said reflection phase shifting mask, and exposing a pattern image of said mask onto a substrate, on which at least one photosensitive resin layer is formed, through an exposure optical system; and removing the photosensitive resin layer from a region other than a desired region in accordance with an exposure amount difference due to the mask pattern image.

9. A method according to claim 8, wherein a coherent factor of the exposure light is set to be not more than 0.5 when said reflection phase shifting mask has at least a portion at which a ratio of an area of a portion on which said translucent film is formed to an area of a portion on which no translucent film is formed is not more than 0.3 or not less than 3.

10. A method according to claim 8, wherein illumination light obtained through a diaphragm having aperture portions formed at at least one pair of n (n=2, 4, 8) positions symmetrical about an optical axis is used as the exposure light or annular illumination light when said transmission phase shifting mask has at least a portion at which a ratio of an area of a portion on which said translucent film is formed to an area of a portion on which no translucent film is formed is 0.3 to 3.

* * * * *

UNITED STATES PATENT AND TRADEMARK OFFICE
CERTIFICATE OF CORRECTION

PATENT NO. : 5,609,977
DATED : March 11, 1997
INVENTOR(S) : Takayuki IWAMATSU, et al.

It is certified that error appears in the above-indentified patent and that said Letters Patent is hereby corrected as shown below:

On the title page, Item [63], the Related U.S. Application Data should read:

--[63]  Continuation of Ser. No. 249,038, May 25, 1994, Pat. No. 5,514,499.--

Signed and Sealed this

Twenty-second Day of July, 1997

Attest:

BRUCE LEHMAN

*Attesting Officer*   *Commissioner of Patents and Trademarks*